US009720101B2

(12) United States Patent
Gordon et al.

(10) Patent No.: US 9,720,101 B2
(45) Date of Patent: Aug. 1, 2017

(54) METHOD OF CONSUMER/PRODUCER RAW MATERIAL SELECTION

(71) Applicant: GLOBALFOUNDRIES INC., Grand Cayman (KY)

(72) Inventors: Michael S. Gordon, Yorktown Heights, NY (US); Kenneth P. Rodbell, Sandy Hook, CT (US); Emmanuel Yashchin, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 589 days.

(21) Appl. No.: 14/242,283

(22) Filed: Apr. 1, 2014

(65) Prior Publication Data

US 2015/0006112 A1    Jan. 1, 2015

Related U.S. Application Data

(60) Provisional application No. 61/840,352, filed on Jun. 27, 2013.

(51) Int. Cl.
*G01T 1/178* (2006.01)

(52) U.S. Cl.
CPC ...... *G01T 1/178* (2013.01); *H01L 2924/0002* (2013.01)

(58) Field of Classification Search
CPC .................................................... G01T 1/178
See application file for complete search history.

(56) References Cited

U.S. PATENT DOCUMENTS

| 4,442,358 | A | 4/1984 | Kreiner |
| 5,541,415 | A | 7/1996 | Shonka |
| 6,448,564 | B1 | 9/2002 | Johnson et al. |
| 7,964,854 | B2 | 6/2011 | Akselrod et al. |
| 8,084,748 | B2 | 12/2011 | Peng et al. |
| 8,168,953 | B2 | 5/2012 | Hijne et al. |
| 8,330,117 | B1 | 12/2012 | Kurin et al. |
| 2014/0203427 | A1* | 7/2014 | Gaynes .................. H01B 1/20 257/734 |

* cited by examiner

*Primary Examiner* — Manuel Rivera Vargas
(74) *Attorney, Agent, or Firm* — Scully, Scott, Murphy & Presser, P.C.

(57) ABSTRACT

A system, method and computer program product for determining whether a material meets an alpha particle emissivity specification that includes measuring a background alpha particle emissivity for the counter and measuring a combined alpha particle emissivity from the counter containing a sample of the material. The combined alpha particle emissivity includes the background alpha particle emissivity in combination with a sample alpha particle emissivity. The decision statistic is computed based on the observed data and compared to a threshold value. When the decision statistic is less than the threshold value, the material meets the alpha particle emissivity specification. The testing times are computed based on pre-specified criteria so as to meet the needs of both Producer and Consumer.

30 Claims, 4 Drawing Sheets

METHOD OF CONSUMER/PRODUCER RAW MATERIAL SELECTION

CROSS REFERENCE TO RELATED APPLICATION

The present invention claims the benefit of U.S. Provisional Patent Application No. 61/840,352 filed Jun. 27, 2013, the entire content and disclosure of which is incorporated herein by reference.

BACKGROUND

The present disclosure is related to measuring alpha particle radiation. More particularly, the present disclosure is related to measuring alpha-particle radiation that is emitted from semiconductor materials.

Control of the alpha-particle radiation can be an issue in semiconductor manufacturing processes. As circuitry dimensions continue to shrink, the flow of alpha-particles naturally present in the basic material can pose a risk for soft errors. In some instances, to mitigate this possibility, risk testing is applied to ensure that semiconductor structures, materials or devices with excessive alpha-particle radiation levels are prevented from being deployed in the field.

SUMMARY

In one embodiment, a method is provided for determining whether a material meets an alpha particle emissivity specification that includes defining an alpha particle emissivity specification for a material selected for testing. A pre-specified consumer-protected particle emissivity is provided that is below the alpha particle emissivity specification. A counter is selected for measuring an alpha particle intensity for the material. A background alpha particle emission rate (counts/hour) is measured for the counter for a first time period. A combined alpha particle emission rate (counts/hour) is measured from the counter containing a sample of the material selected for testing. The combined alpha particle emission rate includes the background alpha particle emission rate in combination with a sample alpha particle emissivity. The sample alpha particle emissivity is computed by taking the combined alpha particle emission rate and dividing by the sample area so that the units are in counts/kh-cm$^2$ and is then compared to the pre-specified consumer-protected particle emissivity. When the sample particle emissivity is less than the pre-specified consumer-protected particle emissivity, the material selected for testing meets the alpha particle emissivity specification.

In one embodiment, a method is provided for determining whether a material meets an alpha particle emissivity specification that includes defining an alpha particle emissivity specification Λ for a module and selecting a counter type for measuring an alpha particle emissivity for the module. A time $T_b$ is calculated for the background emissivity measurement for the counter, and a time $T_g$ is calculated for the emissivity measurement of a sample of the module within the counter using a Poisson based statistical model. The model provides a level of protection for both a consumer and a producer of the module. A background alpha particle emissivity is measured for the counter using the time $T_b$ for background emissivity measurement. A combined alpha particle emissivity is measured from the counter containing the sample of the material for the time $T_g$. A decision statistic is calculated from data obtained during measuring the combined alpha particle emissivity. A threshold is computed for the decision statistic that provides a level of protection for the consumer and the producer. The decision statistic is compared to the threshold for the decision statistic. The module is accepted if the decision statistic is less than or equal to the threshold for the decision statistic.

In another embodiment, a system, method and a computer readable storage medium is provided for determining whether a material meets an alpha particle emissivity specification. In one embodiment, the program of instructions, when executing in a computer system, performs the following steps that include defining the alpha particle emissivity specification Λ for a module selected for testing and selecting a counter type for measuring an alpha particle emissivity for the module. A time $T_b$ is calculated for the background emissivity measurement for the counter and a time $T_g$ is calculated for the emissivity measurement of a sample of the module within the counter using a Poisson based statistical model where the model provides a level of protection for both a consumer and a producer of the module. A background alpha particle emissivity is measured for the counter using the time $T_b$ for background emissivity measurement. A combined alpha particle emissivity is measured from the counter containing the sample of the material for the time $T_g$. A decision statistic is calculated from data obtained during measuring the combined alpha particle emissivity. A threshold is computed for the decision statistic that provides the level of protection for the consumer and the producer. The decision statistic is compared to the threshold for the decision statistic. The module is accepted if the decision statistic is less than or equal to the threshold for the decision statistic.

In yet another embodiment, a system for indicating whether a material meets an alpha particle emissivity specification is provided that comprises a memory storage device, a computing device in communication with the memory storage device and configured to perform a method that includes defining an alpha particle emissivity specification Λ for the module, and selecting a counter type for measuring an alpha particle emissivity for the module. A time $T_b$ is calculated for the background emissivity measurement for the counter and a time Tg is calculated for the emissivity measurement of a sample of the module within the counter using a Poisson based statistical model that provides a level of protection for both a consumer and producer of the module. A background alpha particle emissivity is measured for the counter using the time $T_b$ for background emissivity measurement. A combined alpha particle emissivity is measured from the counter containing the sample of the material for the time $T_g$. A decision statistic is calculated from data obtained during measuring the combined alpha particle emissivity. A threshold is computed for the decision statistic that provides a level of protection for a consumer and a producer. The decision statistic is compared to the threshold for the decision statistic. The module is accepted if the decision statistic is less than or equal to the threshold for the decision statistic.

In another embodiment, a method is provided for determining whether a material meets an alpha particle emissivity specification that includes defining an alpha particle emissivity specification for the material, and selecting a counter for measuring an alpha particle intensity for the module. A background alpha particle emissivity is measured for the counter by taking a background alpha-particle measurement Y of length $T_b$ and calculating a maximum likelihood (MLE) of alpha-particle intensity from $\hat{b}=Y/T_b$. A combined alpha particle emissivity is measured from the counter containing a sample of the module, wherein the combined alpha particle emissivity includes the background alpha particle emissivity in combination with a sample alpha particle emissivity. Measuring the combined alpha particle emissivity includes calculating a length of time used to measure the combined alpha particle emissivity of the module $T_g$ to satisfy the equation: $P_{reject}(\lambda=\lambda_0|\text{Test Duration}=T_g, b=\hat{b})=\gamma$, where $P_{reject}$ is the probability of rejection, $\lambda$ is alpha-particle intensity of module, and b is the alpha-particle intensity of the background, and $\gamma$ is a degree of protection given to a producer. An upper confidence bound is measured for the sample alpha particle emissivity from alpha particle counts observed during measuring the background alpha particle emissivity and while measuring the combined alpha particle emissivity. The upper confidence bound is compared to the alpha particle emissivity specification. The module is accepted if the upper confidence bound is less than or equal to the alpha particle emissivity specification.

In another embodiment, a system, method and a computer readable storage medium is provided for determining whether a material meets an alpha particle emissivity specification. In one embodiment, the program of instructions, when executing, performing the following steps that include defining the alpha particle emissivity specification $\Lambda$ for a module selected for testing and selecting a counter type for measuring an alpha particle emissivity for the module. A background alpha particle emissivity is measured for the counter by taking a background alpha-particle measurement Y of length Tb and calculating a maximum likelihood (MLE) of alpha-particle intensity from $\hat{b}=Y/T_b$. A combined alpha particle emissivity is measured from the counter containing a sample of the module, wherein the combined alpha particle emissivity includes the background alpha particle emissivity in combination with a sample alpha particle emissivity. Measuring the combined alpha particle emissivity includes calculating a length of time used to measure the combined alpha particle emissivity of the module $T_g$ to satisfy the equation: $P_{reject}(\lambda=\lambda_0|\text{Test Duration}=T_g, b=\hat{b})=\gamma$, where $P_{reject}$ is the probability of rejection, $\lambda$ is alpha-particle intensity of module, and b is the alpha-particle intensity of the background, and $\gamma$ is a degree of protection given to a producer. An upper confidence bound is measured for the sample alpha particle emissivity from alpha particle counts observed during measuring the background alpha particle emissivity and while measuring the combined alpha particle emissivity. The upper confidence bound is compared to the alpha particle emissivity specification. The module is accepted if the upper confidence bound is less than or equal to the alpha particle emissivity specification.

In yet another embodiment, a system for indicating whether a material meets an alpha particle emissivity specification is provided that comprises a memory storage device, a computing device in communication with said memory storage device and configured to perform a method that includes defining an alpha particle emissivity specification $\Lambda$ for the module, and selecting a counter type for measuring an alpha particle emissivity for the module. A background alpha particle emissivity is measured for the counter by taking a background alpha-particle measurement Y of length $T_b$ and calculating a maximum likelihood (MLE) of alpha-particle intensity from $\hat{b}=Y/T_b$. A combined alpha particle emissivity is measured from the counter containing a sample of the module, wherein the combined alpha particle emissivity includes the background alpha particle emissivity in combination with a sample alpha particle emissivity. Measuring the combined alpha particle emissivity includes calculating a length of time used to measure the combined alpha particle emissivity of the module $T_g$ to satisfy the equation: $P_{reject}(\lambda=\lambda_0|\text{Test Duration}=T_g, b=\hat{b})=\gamma$, where $P_{reject}$ is the probability of rejection, $\lambda$ is alpha-particle intensity of module, and b is the alpha-particle intensity of the background, and $\gamma$ is a degree of protection given to a producer. An upper confidence bound is measured for the sample alpha particle emissivity from alpha particle counts observed during measuring the background alpha particle emissivity and while measuring the combined alpha particle emissivity. The upper confidence bound is compared to the alpha particle emissivity specification. The module is accepted if the upper confidence bound is less than or equal to the alpha particle emissivity specification.

In another embodiment, a method is provided for determining whether a material meets an alpha particle emissivity specification that includes defining an alpha particle emissivity specification for a module, and providing a pre-specified consumer-protected alpha particle emissivity. A background alpha particle emissivity is measured for a counter. A combined alpha particle emissivity is measured from the counter containing a sample of the module, wherein the combined alpha particle emissivity includes the estimated background alpha particle emissivity in combination with an estimate of a sample alpha particle emissivity. A maximum likelihood estimate of the alpha particle emissivity of the sample is computed from the counts taken during the measurement of the estimated background, the time of the measurement of the estimated background, the counts taken from the measuring of the combined alpha particle emissivity, and the time of the measuring of the combined alpha particle emissivity. It is then computed whether the maximum likelihood estimate is below the pre-specified consumer-protected alpha particle emissivity, is above the alpha particle emissivity specification or between the pre-specified consumer-protected alpha particle emissivity and the alpha particle emissivity specification to determine a degree of evidence that a process is unacceptable based upon:

(a) If $\hat{\lambda}<\lambda_0$ then $D=\ln [L(\Lambda)]-\ln \hat{L}$ (b) If $\hat{\lambda}>\Lambda$ then $D=\ln \hat{L}-\ln [L(\lambda_0)]$ (c) If $\lambda_0 \leq \hat{\lambda} \leq \Lambda$ then $D=\ln [L(\Lambda)]-\ln [L(\lambda_0)]$ where is $\hat{\lambda}$ equal to the maximum likelihood estimate of the alpha particle emissivity, $\Lambda$ is equal to the alpha particle emissivity specification, $\lambda_0$ is equal to the pre-specified consumer-protected alpha particle emissivity and D is the degree of evidence that the process is unacceptable. The degree of evidence that the process is unacceptable D is compared to a threshold H. The module is accepted if the degree of evidence that the process is unacceptable is less than or equal to the threshold H.

In another embodiment, a system, method and a computer readable storage medium is provided with instructions to configure a computing device for determining whether a material meets an alpha particle emissivity specification. In one embodiment, the program of instructions, when executing, performs: defining an alpha particle emissivity specification for the material, and providing a pre-specified consumer-protected alpha particle emissivity. A background alpha particle emissivity is measured for a counter. A combined alpha particle emissivity is measured from the counter containing a sample of the module, wherein the combined alpha particle emissivity includes the estimated background alpha particle emissivity in combination with an estimate of a sample alpha particle emissivity. A maximum likelihood estimate of the alpha particle emissivity of the sample is computed from the counts taken during the measurement of the estimated background, the time of the measurement of the estimated background, the counts taken from the measuring of the combined alpha particle emissivity, and the time of the measuring of the combined alpha particle emissivity. It is then computed whether the maximum likelihood estimate is below the pre-specified consumer-protected alpha particle emissivity, is above the alpha particle emissivity specification or between the pre-specified consumer-protected alpha particle emissivity and the alpha particle emissivity specification to determine a degree of evidence that a process is unacceptable based upon:

(a) If $\hat{\lambda} < \lambda_0$ then $D = \ln [L(\Lambda)] - \ln \hat{L}$ (b) If $\hat{\lambda} < \Lambda$ then $D = \ln \hat{L} - \ln [L(\lambda_0)]$ (c) If $\lambda_0 \leq \hat{\lambda} \leq \Lambda$ then $D = \ln [L(\Lambda)] - \ln [L(\lambda_0)]$ where is $\hat{\lambda}$ equal to the maximum likelihood estimate of the alpha particle emissivity, $\Lambda$ is equal to the alpha particle emissivity specification, $\lambda_0$ is equal to the pre-specified consumer-protected alpha particle emissivity and D is the degree of evidence that the process is unacceptable. The degree of evidence that the process is unacceptable D is compared to an acceptance threshold H. The module is accepted if the degree of evidence that the process is unacceptable is less than or equal to the acceptance threshold H.

In yet another embodiment, a system for indicating whether a material meets an alpha particle emissivity specification is provided that comprises a memory storage device, a computing device in communication with said memory storage device and configured to perform a method that includes defining an alpha particle emissivity specification for the material, and providing a pre-specified consumer-protected alpha particle emissivity. A background alpha particle emissivity is measured for a counter. A combined alpha particle emissivity is measured from the counter containing a sample of the module, wherein the combined alpha particle emissivity includes the estimated background alpha particle emissivity in combination with an estimate of a sample alpha particle emissivity. A maximum likelihood estimate of the alpha particle emissivity of the sample is computed from the counts taken during the measurement of the estimated background, the time of the measurement of the estimated background, the counts taken from the measuring of the combined alpha particle emissivity, and the time of the measuring of the combined alpha particle emissivity. It is then computed whether the maximum likelihood estimate is below the pre-specified consumer-protected alpha particle emissivity, is above the alpha particle emissivity specification or between the pre-specified consumer-protected alpha particle emissivity and the alpha particle emissivity specification to determine a degree of evidence that a process is unacceptable based upon:

(a) If $\hat{\lambda} < \lambda_0$ then $D = \ln [L(\Lambda)] - \ln \hat{L}$ (b) If $\hat{\lambda} > \Lambda$ then $D = \ln \hat{L} - \ln [L(\lambda_0)]$ (c) If $\lambda_0 \leq \hat{\lambda} \leq \Lambda$ then $D = \ln [L(\Lambda)] - \ln [L(\lambda_0)]$ where $\hat{\lambda}$ is equal to the maximum likelihood estimate of the alpha particle emissivity, $\Lambda$ is equal to the alpha particle emissivity specification, $\lambda_0$ is equal to the pre-specified consumer-protected alpha particle emissivity and D is the degree of evidence that the process is unacceptable. The degree of evidence that the process is unacceptable D is compared to an acceptance threshold H. The module is accepted if the degree of evidence that the process is unacceptable is less than or equal to the acceptance threshold H.

In yet another embodiment, a method is provided for determining whether a material meets an alpha particle emissivity specification that included defining an alpha particle emissivity specification for the material and providing a pre-specified alpha particle emissivity. An estimated background alpha particle emissivity is then measured for the counter. A combined alpha particle emissivity is then measured from the counter containing the sample of the material. The combined alpha particle emissivity includes the estimated background alpha particle emissivity in combination with an estimate of a sample alpha particle emissivity. In some embodiments, a maximum likelihood estimate of the alpha particle emissivity of the sample is computed from the counts taken during the measurement of the estimated background, the time of the measurement of the estimated background, the counts taken from the measuring of the combined alpha particle emissivity, and the time of the measuring of the combined alpha particle emissivity. In a following step, it is computed whether the maximum likelihood estimate is below the pre-specified alpha particle emissivity, is above the alpha particle emissivity specification or between the pre-specified alpha particle emissivity and the alpha particle emissivity specification to determine a degree of evidence that a process is unacceptable based upon:

(a) If $\hat{\lambda} < \lambda_0$ then $D = \ln [L(\Lambda)] - \ln \hat{L}$ (b) If $\hat{\lambda} > \Lambda$ then $D = \ln \hat{L} - \ln [L(\lambda_0)]$ (c) If $\lambda_0 \leq \hat{\lambda} \leq \Lambda$ then $D = \ln [L(\Lambda)] - \ln [L(\lambda_0)]$ where is $\hat{\lambda}$ equal to the maximum likelihood estimate of the alpha particle emissivity, $\Lambda$ is equal to the alpha particle emissivity specification, $\lambda_0$ is equal to the pre-specified consumer-protected alpha particle emissivity and D is the degree of evidence that the process is unacceptable. An acceptance threshold H may then be calculated from equations:

$$P(D > H | \lambda = \Lambda, b = \hat{b}) = 1 - \alpha,$$

and $$P(D > H(T_g, \alpha, \gamma) | \lambda = \lambda_0, b = \hat{b}) = \gamma,$$

where P is the probability of acceptance, $\lambda_0$ is the consumer-protected emissivity (which is always lower than $\Lambda$), $\gamma$ is the Producer's risk (typically, $\gamma = 0.1$ is a good choice), $T_g$ is the length of time used to measure the alpha-particle count of the module, and $\alpha$ is a Consumer's risk. The degree of evidence that the process is unacceptable, D, is then compared to the acceptance threshold H. When the degree of evidence that the process is unacceptable D is greater than the acceptance threshold H, the module is accepted.

BRIEF DESCRIPTION OF SEVERAL VIEWS OF THE DRAWINGS

The following detailed description, given by way of example and not intended to limit the disclosed structures and methods solely thereto, will best be appreciated in conjunction with the accompanying drawings, wherein like reference numerals denote like elements and parts, in which.

DETAILED DESCRIPTION

Figure 1A:
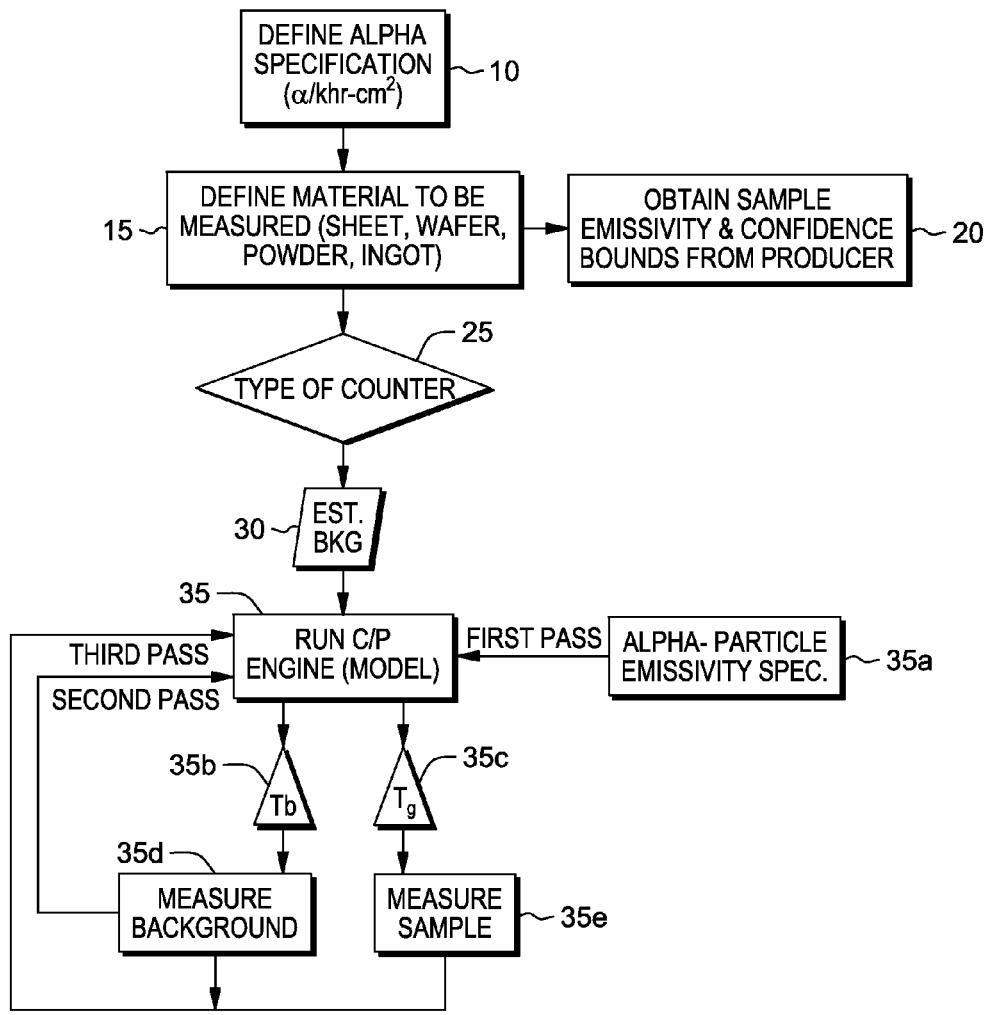
FIGS. 1A and 1B depict a flow chart illustrating one embodiment of an acceptance testing method that may be employed by Consumers and Producers of modules of raw materials in accordance with one embodiment of the present disclosure.

Detailed embodiments of the claimed methods and structures are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific functional details disclosed herein are not to be interpreted as limiting, but merely as a representative basis for teaching one skilled in the art to variously employ the embodiments of the present disclosure.

The embodiments of the present invention relate to novel methods for measuring and determining acceptable levels of alpha particle emissivity. When describing the methods, the following terms have the following meanings, unless otherwise indicated.

"Alpha particle(s)" are a type of ionizing radiation ejected by the nuclei of some unstable atoms. They are large subatomic fragments consisting of two protons and two neutrons. An alpha particle is identical to a helium nucleus having two protons and two neutrons.

The term "Producer" denotes a party that produces a raw material for semiconductor manufacturing.

As used herein, a "Consumer" is a party that is receiving and using raw materials from the producer for use in the manufacture of semiconductor devices.

A "counter" is a device for detecting and counting nuclear particles. As referred to herein, "alphas" is used to denote alpha-particles and "counts" are a number of alpha-particles detected by the counter.

A "module" denotes a batch of raw material from which a sample structure is taken for radiation testing.

In some embodiments, the present disclosure addresses estimation and decisions related to alpha particle radiation that is emitted by modules traded between the Producer of modules and the Consumer of modules. When used in the manufacture of semiconductors, alpha particle emissivity has been reduced using materials in the back-end of the line wiring level and solder bump with low levels of uranium and/or thorium, reducing contamination of alpha-particle emitting elements, and shielding the alpha-particles where possible. The alpha particle emissivity of these materials can be in the ultra-low category, e.g., being less than 2 alphas/khr-cm$^2$. For reference, an alpha-particle emissivity of 2 alphas/khr-cm$^2$ corresponds to the detection of only approximately 1.4 alphas/hr on a 300 mm wafer. Ultra-low background ionization-mode counters have been shown to have backgrounds of around 0.3 alphas/khr-cm$^2$ can be used in one embodiment for alpha particle detection.

When measuring radiation intensity emitted by modules, such as alpha particle emissivity, one typically needs to take into account radiation levels that are inherently present in the measurement tool, i.e., counter. Decisions on acceptability of modules between Producers and Consumers may then be based on separate measurements of background radiation of the counter and measurements taken for the module of material being measured by the counter. The latter measurement produces combined counts from the background and the sample from the module. Based on these measurements, a decision is made on levels of radiation emitted by the module. This decision typically serves as a basis for the Consumer and/or Producer to accept or reject not only the module itself, but also the lot that the module came from.

Figure 1B:
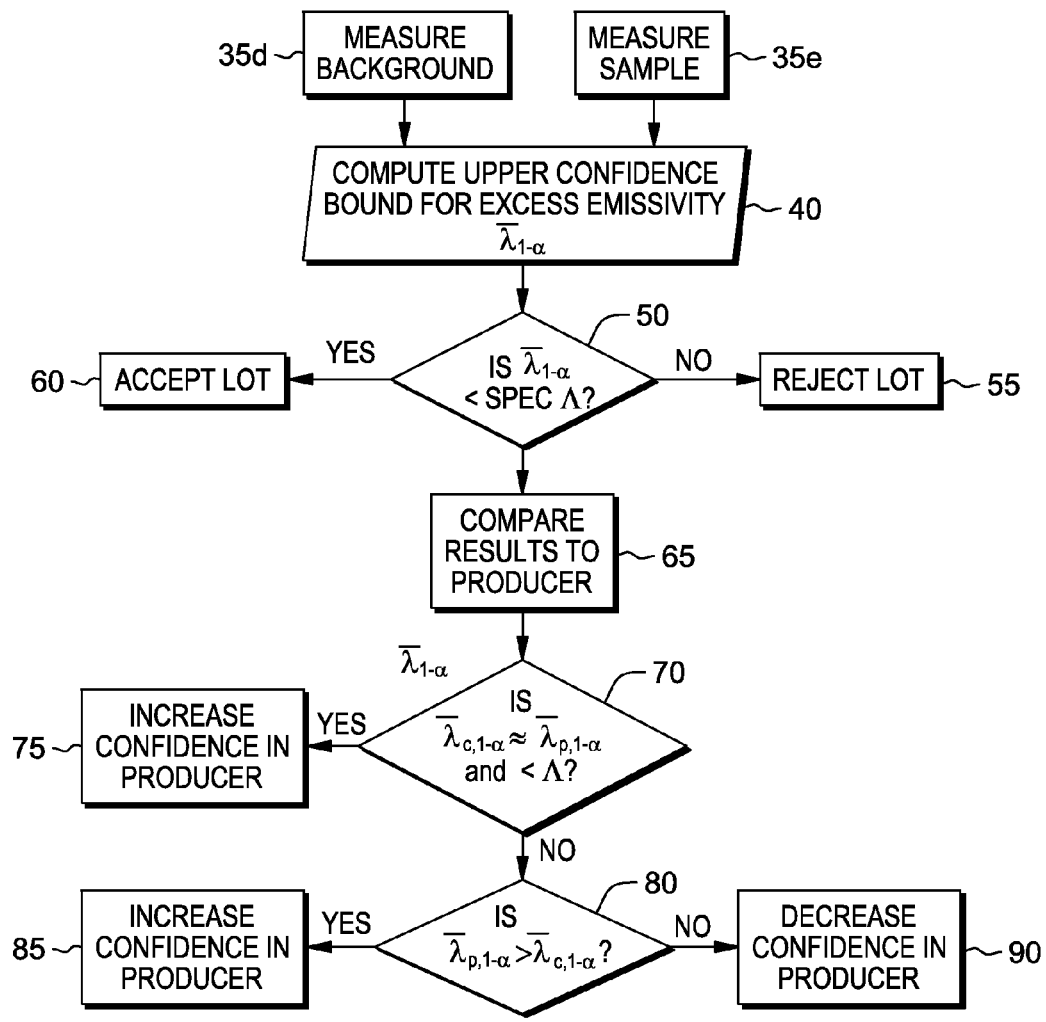

FIGS. 1A and 1B depict a flow chart illustrating one embodiment of an acceptance testing method that may be employed by Consumers and Producers of modules of raw materials. In some embodiments, the acceptance testing method includes a Poisson-based statistical model that can be used by the Consumer, in order to ensure that the materials provided by the Producer meet the desired alpha-particle emissivity specification. As will be described in further detail below, the Poisson-based statistical model is employed in a Consumer/Producer engine at step 35 of the process flow depicted in FIGS. 1A and 1B, which determines a time period $T_b$ for which the background of the counter (without a sample from the module) is measured to provide the background alpha particle count and a time period $T_g$ to measure the alpha particle count of the sample module within the counter (including the counter background). Once the length of time used to measure background alpha-particle count $T_b$ and the length of time used to measure the alpha-particle count of the sample module $T_g$ is defined by the Consumer/Producer engine, those values are used to measure the count of alpha-particles observed during a background measurement Y for time period $T_b$, and the count of alpha-particles observed during a sample module measurement X for time period $T_g$. Subtracting the count of alpha-particles observed during the background measurement Y from the count of alpha-particles observed during the sample module measurement X provides an estimate for the alpha-particle intensity of module λ. When the true alpha-particle emissivity of module λ (normalized for the sample area) is less than the alpha-particle emissivity specification Λ, the module is suitable for use as a raw material. In what follows, a sample of area 1000 cm$^2$ is assumed so that counts/hr is equivalent to counts/khr-cm$^2$. Typically, in some embodiments, the true emissivity cannot be known. In some embodiments, from the data taken in the course of testing estimates of the emissivity can be determined.

In order to decide whether a given lot of desired materials is to be accepted, the Consumer conducts his own test of the alpha-particle emissivity for a sample module. Before measuring the alpha-particle emissivity, an alpha particle emissivity specification Λ is defined as an input to the computer system at step 10 of the process flow depicted in FIG. 1A. The alpha particle emissivity specification Λ is the value that is set by the Consumer, or a customer of the Consumer, as the maximum alpha particle emissivity that will be tolerated in a module that can be accepted.

The alpha-particle emissivity of a sample module is typically measured using a counter. At step 15 of the process flow depicted in FIG. 1A, the composition of the material in the module, and the form that the material in the module, is defined and received at the computer system for determining the type of counter to be used for measuring the alpha-particle emissivity of the module. For example, the composition of the material of the module being measured may include a metal, insulator or a semiconductor material. For example, the metal may include tin, silver, copper, aluminum, tungsten, lead and alloys thereof. In another example, the insulator may be underfill. In another example, the semiconductor material of the module being tested may be a silicon containing semiconductor material. The form of the material in the module may as a powder, ingot, sheet or substrate.

In some embodiments, before measurements of the alpha particle emissivity measurement are made by the Consumer, the Producer may provide to the Consumer the sample emissivity that the Producer has measured from the module, as well as the confidence bounds computed by the Producer, at step 20 of the process flow depicted in FIG. 1A. It is optional that the Producer provides this information to the Consumer, but if the Producer provides this information to the Consumer, the Consumer may integrate the information into the later described Consumer/Producer engine that employs the Poisson-based statistical model. The Consumer/Producer engine ensures that materials provided by the Producer will ultimately meet the desired threshold alpha specification $\Lambda$. As will be described in further detail below, by providing the Consumer with the Producer's calculated sample emissivity and confidence bounds, a joint testing policy may be instituted that could reduce the overall testing time, effort and cost.

Still referring to FIG. 1A, at step 25 of the process flow, in view of the type of alpha particle emissivity material and the form of the material of the module, the type of counter is selected for measuring the alpha particle emissivity of the sample taken from the module, which also will include a measurement of the alpha particle emissivity of the background of the counter. The counter may be any device that can provide a count of alpha particles with a background count rate that is low enough to provide an accurate determination of the sample module emissivity. For example, the counter may be a low background ionization-mode counter from XIA, such as the XIA UltraLo-1800 alpha-particle ionization counter. By "low background" it is meant that about 0.3 $\alpha/kh\text{-}cm^2$. In some embodiments, a low background ionization mode counter can be suitable for testing 300 mm wafers, such as silicon containing wafers. In some other embodiment, a zinc sulfide counter may be employed. For example, the zinc sulfide scintillates when an alpha particle is emitted from the sample and a photomultiplier tube detects the resulting light. In some examples, the zinc sulfide counter is suitable for measuring modules having a thick or irregular shape, such as ingots or pellets. In another example, the counter may be an Alpha Sciences counter or other proportional counter, which may be suitable for modules, such as pairs of 200 mm diameters or single or multiple silicon wafers.

Once a determination has been made regarding the material type, i.e., module type, and the counter type for measuring the particle emissivity of the counter, an estimate for the alpha-particle intensity (e.g., per hour) of the background of the counter is made at step 30 of the process flow depicted in FIG. 1A. Each counter has a background emission rate. Typically, estimates for the background of the counter may be determined from prior use of the counter, or the manufacturer of the counter may have an estimated alpha-particle intensity of the background of the counter.

At step 35 of the process flow depicted in FIG. 1A, the Consumer/Producer engine that employs the Poisson-based statistical model may be employed to determine the length of time used to measure background alpha-particle count $T_b$ at step 35b, and the length of time used to measure the alpha-particle count of the module $T_g$ at step 35c. In some embodiments, the Consumer/Producer engine is run using different input data multiple times to determine a more accurate length of time used to measure background alpha-particle count $T_b$ at step 35b, and compute a length of time used to measure the alpha-particle count of the module $T_g$ at step 35c. In order to achieve the dual objectives of protecting both the consumer and the producer, the first and second time periods $T_b$, $T_g$, are selected to be sufficiently long.

For example, in one embodiment a first run of the Consumer/Producer engine includes receiving inputs of the alpha-particle emissivity specification $\Lambda$ at step 35a and the estimate for the alpha-particle intensity of the background of the counter. The output from the Consumer/Producer engine from the first run of the Consumer/Producer engine at step 35b is a value for the length of time used to measure background alpha-particle count $T_b$, as well as a value for the length of time used to measure the alpha-particle count of the module $T_g$. Using the value for the length of time used to measure background alpha-particle count Tb, the background alpha-particle count b is measured from the counter (without a sample of the module being present in the counter). The measured background alpha-particle count rate is then used as an input into the Consumer/Producer engine in a second run of the engine that also includes the alpha-particle emissivity specification $\Lambda$. The output of the second run of the Consumer/Producer engine may be a corrected value for the length of time used to measure background alpha-particle count $T_b$. A third run of the Consumer/Producer engine includes inputs of the alpha-particle emissivity specification and the corrected value for the length of time used to measure background alpha-particle count $T_b$. The output of the third run of the Consumer/Producer engine may be a corrected value for the length of time used to measure the alpha-particle count rate of the module $T_g$. The Consumer may then select at random a single sample from the module and measures the combined (i.e., background plus sample) alpha particle count rate in the counter for the corrected value for the length of time used to measure the alpha-particle count rate of the module $T_g$ at step 35e of the process flow depicted in FIG. 1A. Further details regarding the Consumer/Producer engine that employs the Poisson-based statistical model are discussed in greater detail hereinbelow.

Based on the difference between of the alpha particle count rate observed during the first and second time periods $T_b$, $T_g$, the consumer estimates the alpha-particle emissivity $\lambda$-particularly, an upper confidence bound for excess emissivity $\overline{\lambda}_{1-\alpha}$ that that is due to the sample of the module at step 40 of the process flow depicted in FIG. 1B. The objective of this test is to ensure, with a high level of confidence, that the alpha particle emissivity $\lambda$ of the sample does not exceed the input pre-specified emissivity value $\Lambda$, which is determined at step 50 of the process flow depicted in FIG. 1B. The confidence level may be computed using a Gaussian model based on the number of alpha particles plus or minus one standard deviation. The Gaussian model is only accurate if the number of detected particles is large. In one example, the number of detected alpha particles is about 100. If the test leads to the conclusion that the alpha particle emissivity $\lambda$ plus a confidence factor (i.e., upper confidence bound $\overline{\lambda}_{1-\alpha}$) of the sample does not exceed a pre-specified emissivity value $\Lambda$, then the sample and the entire lot of the material being tested is accepted at step 60. If the test leads to the conclusion that the alpha particle emissivity $\lambda$ plus the confidence factor of the sample (i.e., upper confidence bound $\bar{\lambda}_{1-\alpha}$) exceeds the pre-specified emissivity value $\Lambda$, then the sample and the entire lot of the material being tested is rejected at step 55.

In addition to the protection that the aforementioned model provides for consumers of raw materials, i.e., Consumers, used in semiconductor manufacturing, the Producer is also provided some protection by the Consumer of the material. An excessive rejection rate of good lots can lead to high losses for the producer, which in turn can result in higher costs for accepted lots.

In some embodiments, to provide some protection to the Producer, the Consumer specifies a pre-specified consumer-protected particle emissivity $\lambda_o$ for which the probability of the lot acceptable is reasonably high so that the Consumer and the Producer can compare alpha particle emissivity results at step 65 of the process flow depicted in FIG. 1B. For example, the pre-specified consumer-protected particle emissivity $\lambda_o$ that is set by the Consumer may be set so that for a module having particle emissivity $\lambda_o$ there is an 90% chance of the material within the lot will be accepted by the Consumer. Values other than 90% (such as 95%, corresponding to Producer's risk of $\gamma=5\%$) can also be used.

In some embodiments, when a Producer manages to keep the emissivity of the sample below the pre-specified particle emissivity $\lambda_0$, he is rewarded with a high probability of product acceptance at step 70 of the process flow that is depicted in FIG. 1B. If (upper confidence bound) alpha particle emissivity $\lambda$ measured by the Consumer ($\bar{\lambda}_{c,1-\alpha}$) is substantially equal to the (upper confidence bound) alpha-particle emissivity of module measured by the Producer, ($\bar{\lambda}_{p,1-\alpha}$) which are both lower than the alpha-particle emissivity specification $\Lambda$, the confidence in the producer may be increased at step 75. If at step 70 of the process flow depicted in FIG. 1B, the (upper confidence bound) alpha particle emissivity measured by the Consumer ($\bar{\lambda}_{c,1-\alpha}$) is not equal to the alpha-particle emissivity of module measured by the Producer ($\bar{\lambda}_{p,1-\alpha}$), a determination is made of whether the alpha-particle emissivity of the module measured by the Producer ($\bar{\lambda}_{p,1-\alpha}$) is greater than the alpha particle emissivity measured by the Consumer $\bar{\lambda}_{c,1-\alpha}$) at step 80. If the (upper confidence bound) alpha-particle emissivity of module measured by the Producer is greater than or equal to the (upper confidence bound) alpha-particle intensity of module measured by the Consumer, the confidence may be increased in the Producer at step 85. If the (upper confidence bound) alpha-particle emissivity of module measured by the Producer is less than the (upper confidence bound) alpha-particle emissivity of module measured by the Consumer, the confidence may be decreased in the Producer at step 85. The degree of confidence in the Producer can be used to reduce the testing time by the Consumer. The following description more clearly describes the Poisson-based statistical model that is employed in a Consumer/Producer engine, as well as further describes each of the aforementioned steps in the process flow depicted in FIGS. 1A and 1B.

Poisson Radiation Model

The Consumer/Producer engine employs a statistical model based on the expected sample and background counts. The statistical model can be employed at step 35 for the Consumer/Producer Engine of the process flow depicted in FIG. 1A. In one embodiment, the statistical model for alpha particle emissivity is based on a Poisson radiation model. A Poisson distribution is a discrete frequency distribution that gives the probability of a number of independent events occurring in a fixed time. In one example, the time between alpha particles emitted from a radioactive source follows a Poisson distribution. For describing some embodiments of the Poisson radiation model, the following variables are defined as follows:

b—alpha-particle intensity (e.g., per hour) of the background $\lambda$—alpha-particle intensity of module $T_b$—the length of time used to measure background alpha-particle count ($T_b=t_b$ in equations 2.1, 2.2, 2.3, 2.4, A.1, A.2, A.3, A.7, A.8, 2.7 and 2.8)

$T_g$—the length of time used to measure the alpha-particle count of the module ($T_g=t_g$ in equations 2.1, 2.2, 2.3, 2.4, A.1, A.2, A.3, A.7, A.8, 2.7 and 2.8)

Y—number of alpha-particle counts detected during the background measurement

X—number of alpha-particle counts detected during the module measurement $\Lambda$—alpha-particle emissivity specification $\lambda_0$—pre-specified consumer-protected particle emissivity In some embodiments, the efficiency eff of the detector, i.e., counter, may be taken into account in the statistical model. For a given alpha-particle, the probability of it being detected is eff<1. Since the Poisson process of alpha-particles of intensity $\lambda$ with detector efficiency eff is a Poisson process with intensity $\lambda$(eff), the methods disclosed herein are directly applicable to all types detectors, i.e., counters, of limited efficiency after re-scaling of the intensity by eff. Therefore, for the following equations, we will assume, without loss of generality, that eff=1.

The Poisson radiation model parameters are the alpha-particle intensity of the background b and the alpha-particle intensity of the module $\lambda$, in which the alpha-particle intensity of the background b is a nuisance parameter. The Poisson radiation model is employed for estimating the alpha-particle intensity of the module $\lambda$. In some embodiments, the confidence bounds for alpha-particle intensity of the module $\lambda$ are of particular interest, since they could be used for disposing the module of the raw material. Because the observables, i.e., the count of alpha-particles observed during the module measurement X and the count of alpha-particles observed during the background measurement Y, satisfy the following:

$$X \sim \text{Poisson}\{(b+\lambda) \times t_g\}$$

$$Y \sim \text{Poisson}\{b \times t_b\} \quad (2.1)$$

The Likelihood methodology ln(L) can be employed to carry out the estimation of the alpha-particle intensity of the module $\lambda$. In one embodiment, the log-likelihood methodology ln(L) is given by:

$$\ln L(X, Y|b, \lambda) = C + X \times \ln(b+\lambda) - (b+\lambda) \times t_g + Y \times \ln(b) - b \times t_b \quad (2.2)$$

In equation (2.2), the variable C is a constant that depends on the data only. The partial derivatives of equation (2.2) are given by equation (2.3):

$$\frac{\partial \log(L)}{\partial b} = \frac{X}{b+\lambda} - t_g + \frac{Y}{b} - t_b \quad (2.3)$$

$$\frac{\partial \log(L)}{\partial \lambda} = \frac{X}{b+\lambda} - t_g$$

Because, the partial derivative for equation (2.2) is provided by equation (2.3), the Maximum Likelihood (MLE) estimates for the alpha-particle intensity of the background b and the alpha-particle intensity of module λ are:

$$\hat{b} Y/t_b$$

$$\hat{\lambda} = \max\{0, (X/t_g) - (Y/t_b)\} \quad (2.4)$$

From the above, in some embodiments, the confidence bounds for the alpha-particle intensity of module _ may be determined by using a number of approaches. One approach for determining the confidence bounds of the alpha-particle intensity of the module λ is a profile likelihood method as discussed in Cox, D. and Hinkley, D. Theoretical Statistics, Chapman and Hall, Boca Raton, 1974, and Rolke, W., Lopez, A and Conrad, J (2009) Limits and confidence intervals in the presence of nuisance parameters (submitted to Elsevier Dec. 20, 2010). In one example of a Profile Likelihood Analysis for the Poisson Model, the value of the log-likelihood ln(L) corresponding to the Maximum Likelihood (MLE) is equal to:

$$\ln \hat{L} = C + X \times \ln(X/t_g) - X + Y \times \ln(Y/t_b) - Y \quad (A.1)$$

For equation (A.1), in order to simplify the analysis, the Maximum Likelihood (MLE) is a non-zero number, i.e., the $(X/t_g) - (Y/t_b) > 0$. In some embodiments, the maximum value of the log-likelihood ln(L) corresponding to the Maximum Likelihood (MLE) may then be calculated under the condition where alpha-particle intensity of module λ is fixed at some value. This maximal value is denoted as ln [L(λ)], which may be equal to:

$$\ln[L(\lambda)] = \quad (A.2)$$
$$C + X \times \ln[b(\lambda) + \lambda] - [b(\lambda) + \lambda] \times t_g + Y \times \ln[b(\lambda)] - b(\lambda) \times t_b,$$
where $$b(\lambda) = \frac{1}{2}\left[ -\left(\lambda - \frac{X+Y}{t_g + t_b}\right) + \sqrt{\left(\lambda - \frac{X+Y}{t_g + t_b}\right)^2 + \frac{4 \times \lambda \times Y}{t_g + t_b}} \right] \quad (A.3)$$

In some embodiments, a particular value of the alpha-particle intensity of module λ is included within the two-sided (1−α)(100%) confidence bounds if:

$$R(\lambda) = 2 \times \{\ln \hat{L} - \ln [L(\lambda)]\} \leq \chi_{1-\alpha}(1) \quad (A.4)$$

where $\chi_{1-\alpha}(1)$ is the (1−α)-quantile of the Chi-square distribution with one degree of freedom. To obtain a one-sided. i.e., upper confidence bound, one may solve equation (A.5):

$$R(\lambda) = \chi_{1-2\alpha}(1), \lambda > \hat{\lambda} \quad (A.5)$$

where $\hat{\lambda}$ is the Maximum Likelihood (MLE). Solving equation (A.5) results in the upper (1−α)(100%) confidence bound for the alpha-particle intensity of the module $\overline{\lambda}_{1-\alpha}$. In some embodiments, lower confidence intervals for the alpha-particle intensity of the module can also be useful. For example, the lower (1−α)(100%) bound $\underline{\lambda}_{1-\alpha}$ obtained by solving equation (A.6), which may be as follows:

$$R(\lambda) = \chi_{1-2\alpha}(1), \lambda < \hat{\lambda} \quad (A.6)$$

Note that practical implementation of the profile likelihood tests requires careful handling of limit conditions. For example, equations (A.1)-(A.2) are not formally defined for Y=0, X=0 or b(λ)=0. Therefore, implementation algorithms can take into account such possibilities and define the corresponding values by using appropriate limits. For example, for X=0, the expression $X \times [\ln(X/t_g) - 1]$ in equation (A.1) may be defined as zero.

From the numerical perspective, a savings in time from solving equations (A.5)-(A.6) can be obtained by using easily computable derivatives:

$$-\frac{1}{2} R'(\lambda) = [b'(\lambda) + 1]\left[\frac{X}{b(\lambda) + \lambda} - t_g\right] + b'(\lambda)\left[\frac{Y}{b(\lambda)} - t_b\right], \quad (A.7)$$

where $$b'(\lambda) = \frac{Y - b(\lambda)[t_g + t_b]}{(t_g + t_b)[2b(\lambda) + \lambda] - (X + Y)} \quad (A.8)$$

Using equations (A.1) through (A.8), the upper and lower confidence bounds for the alpha-particle intensity of the module λ may be calculated. In what follows, the upper and lower (1−α)(100%) confidence bounds for alpha-particle intensity of the module λ are referred to as $\overline{\lambda}_{1-\alpha}$ and $\underline{\lambda}_{1-\alpha}$, respectively. This type of inference can also be used for testing the hypothesis of existence of excess radiation and similar hypotheses, as described below.

The above approach, i.e., profile likelihood method, can also be used in order to test a hypothesis about the alpha-particle intensity of the module λ. For example, the Consumer and/or Producer may want to know whether there is statistically significant evidence of excess radiation existence, or whether there is evidence that alpha-particle intensity of the module λ exceeds some pre-specified threshold value A. For example, to test the hypothesis H0: $\underline{\lambda}_{1-\alpha} \leq A$ vs. the alternative H1: $\underline{\lambda}_{1-\alpha} > A$, one could apply the following test:

Reject H0 if: $\underline{\lambda}_{1-\alpha} > A$; otherwise, do not reject H0. (2.5)

In practice, tests with A=0 are of special interest. By using software simulating various radiation conditions, one can easily establish the length of tests needed to establish definitively existence of excess alpha-particle intensity exceeding a specific magnitude λ=A. For example, under the assumption that $(t_b, b, \lambda = A + \Delta)$ are set (Δ>0) and where Δ is the deviation above A, one can establish the module test value $T_g$ for which:

$$\text{Prob}\{\text{Reject } H0 | \lambda = A + \Delta, t_g = T_g\} = 0.99 \quad (2.6)$$

When the counts (X,Y) are large (typically, of magnitude 100), bounds of reasonable quality may be obtained via normal approximation to distribution of $\hat{\lambda} = \max\{0, (X/t_g) - (Y/t_b)\}$ given by equation (2.4). In particular:

$$\text{Var}(\hat{\lambda}) \approx \frac{b + \lambda}{t_g} + \frac{b}{t_b} \approx \frac{X}{t_g^2} + \frac{Y}{t_b^2} \quad (2.7)$$

Therefore, the Gaussian approximation to the upper (1−α) (100%) confidence bound can be obtained as follows:

$$\overline{\lambda}_{1-\alpha}(Gauss) = \hat{\lambda} + z_{1-\alpha} \sqrt{\frac{X}{t_g^2} + \frac{Y}{t_b^2}} \quad (2.8)$$

where $z_{1-\alpha}$ is the (1−α)-quantile of the Gaussian distribution. Lower confidence bounds are obtained analogously, and they can serve as a basis of testing hypotheses via procedures of equation (2.5).

In some embodiments, while a Gaussian approximation leads to confidence bounds that are "reasonable" when the counts (X, Y) are large, the measurements of the present disclosure involve background radiation levels as low as b=2 alpha-particles per hour, and practically significant levels of excess radiation are typically in the range $\lambda<2$. Under such conditions, the Gaussian approximation becomes increasingly inaccurate, leading to distortion of risks that generally works against the consumer. The reason for that, as will be demonstrated in hereinbelow, is that consumer's protection is mostly governed by the upper confidence bounds for $\lambda$. Because the sampling distribution of $\hat{\lambda}$ is right-skewed, the Gaussian approximation produces upper bounds for $\lambda$ that have less than nominal coverage, resulting in higher than anticipated risk of accepting substandard product.

In an alternative embodiment, one can develop a module testing strategy based on the confidence bounds provided above. This strategy is useful in the environment where the module testing times can be adjusted, to make sure that the times are long enough to protect the Producer. It has been determined that, in the environment where testing times are kept relatively stable, this strategy is somewhat biased in the sense that under-estimation or over-estimation of background radiation affects mostly the Producer. In such environment, special adjustments might be needed to offset this effect. One could also need adjustments to adjust the coverage probabilities so as to achieve nominal coverage (even in the case when profile likelihood method is used), since coverage probabilities are directly linked to operating characteristic curves of the acceptance policies. As an alternative, a Likelihood Ratio policy is introduced that, under some conditions, can be viewed as more balanced in the way it handles Consumer/Producer risk sharing.

In some alternative embodiments, a decision method may be selected for Consumer and Producer risk management. There may be a number of ways to obtain acceptance sampling procedures based on radiation measurements in the presence of background noise. One relatively straightforward way is to use the confidence bound (CB) methodology. A somewhat more appealing, from the statistical point of view, is the approach based on likelihood ratio tests. Acceptance sampling procedures based on confidence bounds (CB) and likelihood ratio (LR) tests are now discussed in greater detail.

Acceptance Sampling Procedures Based on Confidence Bounds (CB)

In some embodiments, the acceptance sampling procedures that are based on confidence bounds (CB) assume that the Consumer receives a module of semiconductor raw material and decides whether this module is acceptable. For example, the Consumer can declare the following policies, i.e., a Consumer's Strategy in equation (3.1), based on the alpha-particle emissivity specification $\Lambda$ for the upper $(1-\alpha)$ (100%) confidence bound $\overline{\lambda}_{1-\alpha}$ for excess radiation:

Consumer's strategy:

if $\overline{\lambda}_{1-\alpha} > \Lambda$ then reject the module if $\overline{\lambda}_{1-\alpha} \leq \Lambda$ then accept the module (3.1)

In some embodiments, the motivation for this policy in equation (3.1) is that the Consumer has a specification for an alpha-particle emissivity specification $\Lambda$ for excess radiation, and needs to be $(1-\alpha)(100\%)$ confident that this specification has not been violated. If alpha-particle intensity of the module $\lambda$ is equal to the alpha-particle emissivity specification $\Lambda$, then the probability of rejection is $(1-\alpha)$. In some embodiments, the Consumer's strategy is included in the Consumer/Producer engine model at step 35 of the process flow depicted in FIG. 1A. In what follows, this rejection probability will be denoted as $P_{reject}$. In some embodiments, the Consumer/Produce engine model employs only the Consumer's strategy of equation 3.1. In practice, however, typically the Consumer does not act in such a unilateral fashion without considering sample emissivity and confidence bounds produced by the Producer, because it may be advantageous provide a certain level of protection for the Producer. Thus, the Consumer needs a good understanding of what levels of excess radiation $\lambda$ can be considered acceptable. Accordingly, in some embodiments, the consumer could pick an acceptable value for a threshold alpha-particle emissivity $\lambda_0$ that is less than the alpha-particle emissivity specification $\Lambda$) and declare the following Consumer's policy that is implemented by iterative processing as now described:

(Step 1) Take a background alpha-particle measurement of length $T_b$. Taking the background alpha-particle measurement for the length Tb is depicted as step 35d in the process flow depicted in FIG. 1A. Denote by Y the observed count of alpha-particles of the background. The corresponding Maximum Likelihood (MLE) of alpha-particle intensity (e.g., per hour) of the background is then calculated from $\hat{b}=Y/T_b$ (see above description of equation 2.4).

(Step 2) Calculate the necessary test time $T_g$, i.e., the length of time used to measure the alpha-particle count of the module, so as to satisfy the equation:

$$P_{reject}(\lambda=\lambda_0 | \text{Test Duration}=T_g, b=\hat{b})=\gamma, \quad (3.2)$$

where the alpha particle emissivity $\lambda$ is a sufficiently small value that represent the Producer's risk (note that this equation can only be solved if $T_b$ is sufficiently high). In some embodiments, solving equation (3.2) may be done via simulation, in which for a given length of time used to measure the alpha-particle count of the module $T_g$ one can generate a large number of module test cases corresponding to the estimated background $\hat{b}=Y/T_b$. For every replication, an upper confidence boundary (CB) is constructed and a decision to accept/reject is made. The left hand side (LHS) of equation (3.2) is then evaluated based on simulated replications, and the value of the length of time used to measure the alpha-particle count of the module $T_g$ is then found for which equation (3.2) is satisfied.

If the equation (3.2) cannot be solved (even as $T_g \rightarrow \infty$) or the resulting length of time used to measure the alpha-particle count of the module $T_g$ is too high to be of practical value, this can be an indication that the value of the length of time used to measure background alpha-particle count $T_b$ is too low. In some cases of this type (e.g. if counts are monitored in real time) the Consumer can, for example, extend the background period. At some point, $T_b$ will then become long enough to ensure that (in conjunction with some practically meaningful $T_g$) both Consumer and Producer interests can be accommodated. In other cases the Consumer could commit to additional background measurement time to be applied immediately after the module measurement, so that the overall $T_b$ is high enough. In some cases long enough $T_b$ can be obtained by aggregating data (including counts and measurement times) across several measurement periods. One example of a length of time used to measure background alpha-particle count $T_b$ that is suitable for solving equation 3.2 may range from 0.1 hours to 1000 hours. In another example of a length of time used to measure background alpha-particle count $T_b$ that is suitable for solving equation 3.2 may range from 1 hour to 100 hours. In the following description, we assume that $T_b$ is high enough so that equation 3.2 can be solved and lead to reasonably low $T_g$. One example of a reasonably low Tg means a time period of 17 hours.

(Step 3) Take the module alpha-particle measurement of length Tg at step 35e of the process flow depicted in FIG. 1A. Denote by X the observed count of alpha-particles of the module.

(Step 4) Compute the upper $(1-\alpha)(100\%)$ confidence bound $\overline{\lambda}_{1-\alpha}$ (based on Y, $T_b$, X, $T_g$) using equation (2.8)

Referring to step 40 of the process flow depicted in FIG. 1A, the upper confidence level that has been determined at (Step 4) of the Consumer's policy is compared to the alpha-particle emissivity specification $\Lambda$. If the upper confidence bound ($\overline{\lambda}_{1-\alpha}$) computed for the sample of the module is greater than the alpha-particle emissivity specification $\Lambda$, i.e, $\overline{\lambda}_{1-\alpha} > \Lambda$, the entire lot for the module is rejected at step 55. If the upper confidence bound ($\overline{\lambda}_{1-\alpha}$) is less than or equal to the alpha-particle emissivity specification $\Lambda$, i.e, $\overline{\lambda}_{1-\alpha} \leq \Lambda$, the entire lot the module is accepted at step 60 of the process flow depicted in FIG. 1A.

Figure 2:
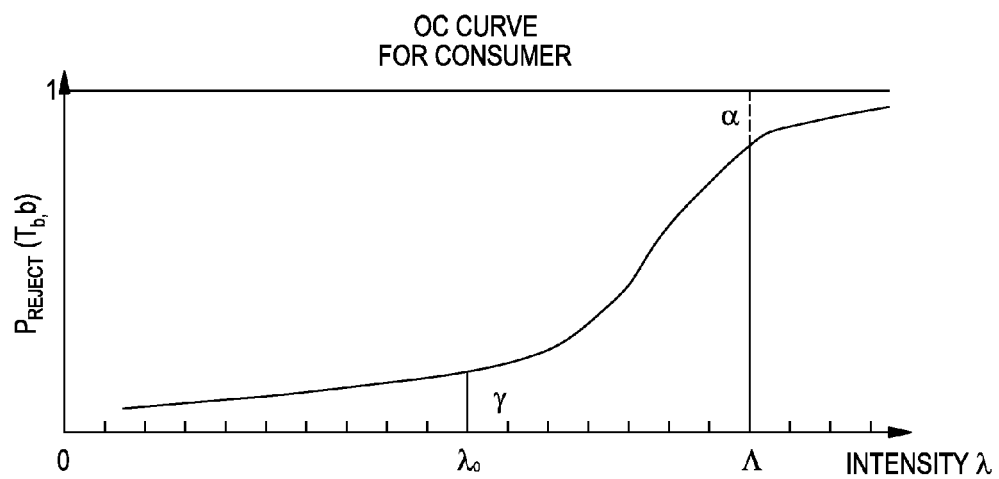
FIG. 2 depicts a plot of an operating characteristic (OC) curve that may be employed by the Consumer, in accordance with one embodiment of the present disclosure.

In some embodiments, following implementation of the Consumer's policy, the Consumer's risk can be described by the Operating Characteristic (OC) curve shown in FIG. 2. In some embodiments, the operating characteristic (OC) curve is computed conditional on level of background alpha-particle intensity b and on time to measure the background $T_b$. The value of the length of time used to measure the alpha-particle count of the module $T_g$ is then selected so as to satisfy equation (3.2). In general, this curve may change from module to module, as it depends on the background count Y measured prior to testing the module.

In practice, it may be inconvenient to change the length of time used to measure the alpha-particle count of the module $T_g$ every time a new module is being measured. For the sake of operational convenience, the Consumer could choose to select the value of the length of time used to measure the alpha-particle count of the module $T_g$ based on the "prevailing" estimate of the background radiation b=b0, and continue using this time $T_g$ until evidence emerges that the current level of background radiation differs from $b_0$ in some practically (rather than statistically) significant way. Along with b=$b_0$, the Consumer maintains the effective background counts and effective background test time ($Y_0$, $T_{b0}$) that are used in lieu of the actually observed (Y, $T_b$). This represents a form of aggregating information over several background test periods; typically, $b_0 = Y_0 / T_{b0}$.

In another embodiment, a Modified Consumer's Policy is provided. In some embodiments, the operating characteristic (OC) curve that is depicted in FIG. 2, and used in the implementation of the above noted Consumer's policy, may change from module to module, as it can depend on the count of alpha-particles observed during the background measurement Y and alpha particles observed during module measurement X. In some embodiments of this method, an opportunity is provided to change the testing time after observing the background count Y over the length of time used to measure the alpha-particle background count ($T_b$) similar to the above noted Consumer's policy. However, in the Modified Consumer's Policy this may only be done when the count of alpha-particles observed during the background measurement Y contradicts the presumed level $b_0$. For example, a $P_{reject}$ value may be measured for the following described equation (3.2a) related to the hypothesis the background emissivity is the effective estimated background $b_0$ based on the count Y and when this p-value becomes too small, e.g., on the order of 1%, the hypothesis can be rejected, and the effective estimated background b0 and other estimated quantities can be re-computed. The Modified Consumer's Policy may be executed by iterating steps 1-3, as follows:

Step 1) Take a background alpha-particle measurement of length $T_b$. Similar to the above described Consumer Policy, this step of the Modified Consumer Policy is depicted as step 35d of the process flow that is depicted in FIG. 1A. Denote by Y the observed count of alpha-particles. If, in light of this measurement, one can conclude that the current level of the alpha intensity of the background b differs from $b_0$ by an amount higher than some pre-specified value $\delta$, then re-compute the prevailing level $b_0$ (and the corresponding $Y_0$, $T_{b0}$) and re-calculate $T_g$ so as to satisfy the relation:

$$P_{reject}(\lambda = \lambda_0 | \text{Test Duration} = T_g, b = b_0) = \gamma, \quad (3.2a)$$

where $\gamma$ is a sufficiently small, e.g., 10%, value that represent the Producer's risk. Otherwise, continue using the current values of ($b_0$, $Y_0$, $T_{b0}$, $T_g$).

(Step 2) Take the module alpha-particle measurement of the length of time used to measure the alpha-particle count of the module $t_g$. This step of the Modified Consumer Policy is depicted as step 35d of the process flow that is depicted in FIG. 1A. Denote by X the observed count of alpha-particles.

(Step 3) Compute the upper $(1-\alpha)(100\%)$ confidence bound $\overline{\lambda}_{1-\alpha}$ (based on $Y_0$, $T_{b0}$, X, $T_g$) using equation (2.8) at step 40 of the process flow that is depicted in FIG. 1B. In this embodiment, effective (i.e., estimated or approximated based on data aggregation) background counts $Y_0$ is entered for observed background counts Y in equation (2.8), and the effective (i.e., estimated or approximated based on data aggregation) background test time $T_{b0}$ is entered for the observed background time $T_b$.

Similar to the Consumer's Policy, in the Modified Consumer's Policy, the upper confidence level that has been determined at (Step 3) of the Modified Consumer's policy is compared to the alpha-particle emissivity specification $\Lambda$. This is depicted at Step 50 of the process flow depicted in FIG. 1B. If the upper confidence bound ($\overline{\lambda}_{1-\alpha}$) computed for the sample of the module is greater than the target alpha-particle emissivity specification $\Lambda$, i.e, $\overline{\lambda}_{1-\alpha} > \Lambda$, the entire lot for the module is rejected at step 55. If the upper confidence bound ($\overline{\lambda}_{1-\alpha}$) is less than or equal to the alpha-particle emissivity specification $\Lambda$, i.e, $\overline{\lambda}_{1-\alpha} \leq \Lambda$, the entire lot the module is accepted at step 60 of the process flow depicted in FIG. 1A.

Note that the decision step (3) is based on ($Y_0$, $T_{b0}$) and not (Y, $T_b$). The Modified Consumer Policy does not specify tests that one should perform in order to decide that a switch to new level $b_0$ (and, consequently, $T_g$) is necessary. There is considerable flexibility on ways in which such a conclusion can be reached. In one example, one could use the theory of control schemes to monitor background radiation counts, with an objective of triggering a signal as soon as the deviation of magnitude $\delta$, or higher from the currently prevailing level $b_0$ is detected (e.g., see Hawkins, D. and Olwell, D. Cumulative Sum Charts and Charting for Quality Improvement, Springer, New York, 1998).

Typically, the Modified Consumer Policy leads to an Operating Characteristic (OC) curve, as depicted in FIG. 2. FIG. 2 is a plot of the Operating Characteristic (OC) curve of the consumer, in which the y-axis is the probability of rejection and the x-axis is the alpha-particle intensity of module. Since under the Modified Consumer Policy, the Operating Characteristic (OC) curve can be expected to remain stable for non-trivial segments of time, it could be made available to the Producer in order to help him in selecting his own screening policy.

In some embodiments, the aforementioned Modified Consumer Policy may be further modified to adjust the values $Y_0$, $T_{b0}$, after each measurement of Y (that is based on $T_b$). For example, if $T_{b0}=20$ hours (i.e., fixed and corresponding to aggregated background measurement periods), and $Y_0$ is equal to be the total count of background particles observed over the 20 hours. Then there is identified a pair $(T_b, T_g)$, using simulated data, that satisfies equation (3.2a) under the assumption that the pair $Y_0$, $T_{b0}$, is adjusted after each simulated sample. In this case the pair $(T_b, T_g)$ will change for every module, since the pair $Y_0$, $T_{b0}$ will be different for every module.

A test can now be run in one of two ways: policy (a) after observing background for time $T_b$ and observing the count Y, re-compute $Y_0$, $T_{b0}$ and then re-compute $T_g$ via equation (3.2) so as to provide the desired protection for Producer, and then run the sample for the re-computed $T_g$ time units; or policy (b) after observing background for time $T_b$ and observing the count Y, re-compute $Y_0$, $T_{b0}$ and then run the sample for the original $T_g$ time units.

When computing the pair $(T_b, T_g)$ via simulation as described above, one might choose to simulate under policy (b), to shorten the time needed to compute this pair but when actually running the test, one could use $T_b$ in conjunction with policy (a)—i.e., re-compute $T_g$ after observing Y.

In some embodiments, the Consumer will announce to the Producers the level of radiation $\lambda_0$, i.e., threshold target alpha particle emissivity, that he considers acceptable and "protected" by low rejection probability $\gamma$. In some embodiments, this is all the information the Producer will know. Typically, the Producer would not want to submit modules with excess radiation above the threshold target alpha particle emissivity $\gamma_0$, because of the risk of rejection $\gamma$. In some embodiments, the Producer may develop his own testing plan, under which modules will be rejected (at the Producer's level) with high probability $(1-\tilde{\alpha})(100\%)$ if the excess radiation is greater than or equal to the threshold target alpha particle emissivity $\lambda_0$. So, the Producer's test calls for selecting test times $(\tilde{T}_b, \tilde{T}_g)$, observing the background and module counts $(\tilde{Y}, \tilde{X})$, computing the $(1-\tilde{\alpha})(100\%)$ upper confidence bound $\tilde{\lambda}_{1-\tilde{\alpha}}$, for $\lambda$ and adopting a strategy. One example of a Producer's strategy is as follows:

if $\tilde{\lambda}_{1-\tilde{\alpha}} > \lambda_0$, then reject the module

Otherwise, accept the module if $\tilde{\lambda}_{1-\tilde{\alpha}} \leq \lambda_0$. (3.3)

In what follows, the rejection probability of the strategy in equation (3.3) is referred to as $\tilde{P}_{reject}$. Clearly, under this strategy the Producer will ensure that a module with excess radiation greater than the consumer-protected alpha particle emissivity $\lambda_0$ (that plays the role of a threshold in equation (3.3)) will have a high probability $(1-\tilde{\alpha})$ of rejection. The Producer will also want the values $(\tilde{T}_b, \tilde{T}_g)$ to be high enough, so as not to reject values of the alpha particle emissivity $\lambda$ that is considered as being "high quality", i.e., having a good chance of acceptance. For example, by "high quality" it can be meant that $\lambda = \lambda_0/2$, which can be referred to as $\tilde{\lambda}_0$. Clearly, $\tilde{\lambda}_0 < \lambda_0$. This leads to the following Producers Approach:

1) Reject the module if the upper confidence bound $(\overline{\lambda}_{1-\alpha})$ for the alpha-particle intensity of module $\lambda$ is greater than the consumer-protected alpha-particle emissivity $\lambda_0$ i.e, $\overline{\lambda}_{1-\alpha} > \lambda_0$.
2) Otherwise, accept the module if the upper confidence bound $(\overline{\lambda}_{1-\alpha})$ for the alpha-particle intensity of module $\lambda$ is less than or equal to the consumer-protected alpha-particle emissivity $\lambda_0$, i.e, $\overline{\lambda}_{1-\alpha} \leq \lambda_0$.

One example of a Producer's Approach to carry out the above described Producer's strategy is by carrying out the following steps:

(Step 1) Take a background alpha-particle measurement of length $\tilde{T}_b$. Denote by $\tilde{Y}$ observed count of alpha-particles and the corresponding Maximum Likelihood (MLE) by $\hat{b}_{\sim} = \tilde{Y}/\tilde{T}_b$.

Step 2) Calculate the necessary test time $\tilde{T}_g$ so as to satisfy the equation:

$$\tilde{P}_{reject}(\lambda=\tilde{\lambda}_0|\text{Test Duration}=\tilde{T}_g, b=\hat{b}_{\sim})=\tilde{\gamma}, \quad (3.4)$$

Where $\tilde{\gamma}$ is a sufficiently small value that represent the Producer's internal risk. One example of a $\tilde{\gamma}$ value that is sufficiently small to represent the Producer's internal risk is 10%.

(Step 3) Take the module alpha-particle measurement of length $\tilde{T}_g$. Denote by $\tilde{x}$ the observed count of alpha-particles.

(Step 4) Compute the upper $(1-\tilde{\alpha})(100\%)$ confidence bound $\tilde{\lambda}_{1-\tilde{\alpha}}$. If $\tilde{\lambda}_{1-\tilde{\alpha}} > \lambda_0$, then reject the module. Otherwise, accept the module.

Similar to the Consumer's policy, in the Producer's Policy it is assumed that $\tilde{T}_b$ is high enough so that equation (3.4) can be solved. Using the above described Producer's Policy, the Producer may calculate the sample emissivity and confidence bounds that he can provide to the Consumer at step 20 of the process flow depicted in FIG. 1A.

Figure 3:
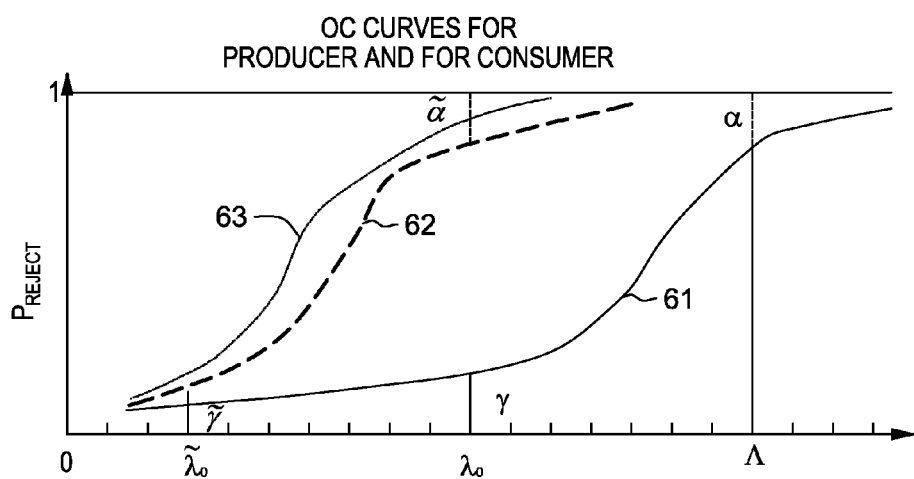
FIG. 3 depicts a plot of operating characteristic (OC) curves corresponding to a combination of Consumer's and Producer's policies, in accordance with one embodiment of the present disclosure.

FIG. 3 depicts rejection operational characteristic rejection probability curves corresponding to combination of the above described Consumer's and Producer's policies. The data line in FIG. 3 identified by reference number 61 is the probability curve corresponding to the Consumer's Policy. The data line in FIG. 3 identified by reference number 62 is the probability curve corresponding to the Producer's Policy. The data line identified by reference number 63 is the operating characteristic (OC) curve corresponding to combination of both tests, i.e., Consumer and Producer Policies. The data line identified by reference number 63 is computed from equation (3.5).

As in the case of Consumer, the Producer might consider it undesirable to have a fully dynamic module testing time, because of logistical and cost reasons. Under such conditions, the Producer could implement a modified policy that relies on his "prevailing" background intensity $\tilde{b}_0$ and the corresponding effective background counts and testing times $\tilde{Y}_0$, $\tilde{T}_{b0}$; the latter are kept constant (together with the test time $\tilde{T}_0$) until there is enough evidence to conclude that the background intensity has changed by a practically significant amount. A Modified Producer's approach may be iterated using the following steps:

Step 1) Take a background alpha-particle measurement of length $\tilde{T}_b$. Denote by $\tilde{Y}$ observed count of alpha-particles. If, in light of this measurement, one can conclude that the current level of the observed background intensity b differs from the prevailing (estimated) background intensity $\tilde{b}_0$ by an amount higher than some pre-specified valued $\delta$, then re-compute $\tilde{b}_0$ (and the corresponding $\tilde{Y}_0$, $\tilde{T}_{b0}$) and re-calculate $\tilde{T}_g$ so as to satisfy the relation:

$$\tilde{P}_{reject}(\lambda=\tilde{\lambda}_0|\text{Test Duration}=\tilde{T}_g, b=\tilde{b}_0)=\tilde{\gamma}, \quad (3.4)$$

where $\tilde{\gamma}$ is a sufficiently small value that represent the Producer's internal risk. Otherwise, continue using the current values of $\tilde{b}_0$, $\tilde{Y}_0$, $\tilde{T}_{b0}$, $\tilde{T}_g$.

(Step 2) Take the module alpha-particle measurement of length $\tilde{T}_g$. Denote by $\tilde{x}$ the observed count of alpha-particles.

(Step 3) Compute the upper $(1-\tilde{\alpha})(100\%)$ confidence bound $\tilde{\lambda}_{1-\tilde{\alpha}}$ based on $\tilde{Y}_0$, $\tilde{T}_{b0}$, $\tilde{X}$, $\tilde{T}_0$. If $\tilde{\lambda}_{1-\tilde{\alpha}} > \lambda_0$, then reject the module. Otherwise, accept the module.

In some embodiments, the above-described Producer's Policy may be modified using the modifications described above for the Modified Consumer's Policy. For example, in some embodiments, it is not required that the Producer choose the Consumer's acceptable value for the threshold target alpha particle intensity of the module $\lambda_O$ as a basis for rejection decisions.

In practical situations, Consumer and Producer could benefit from information about each other's policies and conditions. For example, the curves of type shown in FIG. 3 can be used to define the overall fraction of accepted modules as a function of alpha-particle intensity of module $\lambda$ in the following equation:

$$p(\lambda)=[1-\tilde{P}_{reject}(\lambda)]\times[1-P_{reject}(\lambda)] \quad (3.5)$$

Equation 3.5 may serve as the basis for the Consumer/Producer engine model at step 35 of the process flow depicted in FIG. 1A.

Now suppose that it is known, from historic considerations, that the Producer's process yields modules for which the intensities are distributed in accordance with the density $u_p(\lambda)$. Then the "outgoing" density of the modules that pass both Producer's and Consumer's inspection is given by:

$$u(\lambda) = \frac{u_0(\lambda)p(\lambda)}{\int_0^\infty u_0(\lambda)p(\lambda)d\lambda} \quad (3.6)$$

In a similar way, the outgoing density of radiation intensities following the Producer's own filter is proportional to $u_0(\lambda)[1-\tilde{P}_{reject}(\lambda)]$. Another useful function is the "probability of disagreement" $p_d(\lambda)$ corresponding to the event that the module is passed by the Producer, but then rejected by the Consumer:

$$p_d(\lambda)=[1-P_{reject}(\lambda)]\times \tilde{P}_{reject}(\lambda) \quad (3.7)$$

Equation 3.7 may be integrated into the process flow depicted in FIG. 1B at step 65. The events of "disagreement", i.e., rejection by consumer of a module that was passed by the Producer under a producer-specified test can be used to construct an "index of trustworthiness" associated with the given Producer. This index could be defined as a fraction of time in which the outcomes of Producer's and Consumer's tests agreed on acceptance of a module. This fraction can be computed as a straight or time-weighted average of agreement counts over time. The index can play a role in establishing weights attached to future outcomes reported by the Producer. For example, at step 70 of the process flow depicted in FIG. 1B, the upper confidence level for the alpha-particle intensity of module measured by the Consumer is compared with the upper confidence level for the alpha-particle intensity of module measured by the Producer. If the upper confidence level for the alpha-particle intensity of module measured by the Consumer is substantially equal to the upper confidence level for the alpha-particle intensity of module measured by the producer, which are both lower than the alpha-particle emissivity specification _, the confidence in the producer may be increased at step 75. If at step 70 of the process flow depicted in FIG. 1B, the upper confidence level for the alpha-particle intensity of module measured by the Consumer is not substantially equal to the upper confidence level for the alpha-particle intensity of module measured by the producer, a determination of whether the upper confidence level for the alpha-particle intensity of module measured by the producer is greater than the upper confidence level for the alpha-particle intensity of module measured by the Producer at step 80. If the upper confidence level for the alpha-particle intensity of module measured by the Producer is greater than or equal to the upper confidence level for the alpha-particle intensity of module measured by the Consumer, the confidence may be increased in the Producer at step 85. If the upper confidence level for the alpha-particle intensity of module measured by the Producer is less than the upper confidence level for the alpha-particle intensity of module measured by the Consumer, the confidence may be increased in the Producer at step 85.

As indicated above, a reduction in the testing times ($T_b$, $T_g$) may be achieved if the Producer is trustworthy and is willing to participate in the testing process and share his data with the Consumer at step 20 of the process flow depicted in FIG. 1A. If the Producer is willing to supply his upper confidence bound for $\lambda$ of the same level of confidence $(1-\alpha)(100\%)$ that the Consumer is using (i.e., the bound $\tilde{\lambda}_{1-\alpha}$) then the Consumer could incorporate this information, e.g., in a Consumer Strategy as follows:

if $(1-w)\bar{\lambda}_{1-\alpha}+w\tilde{\lambda}_{1-\alpha}>\Lambda$ then reject the module If $(1-w)\bar{\lambda}_{1-\alpha}+w\tilde{\lambda}_{1-\alpha}\leq\Lambda$ then accept the module $\quad$ (3.1a2)

In some embodiments, the Consumer's strategy in equation (3.1a2) is included in the Consumer/Producer engine model at step 35 of the process flow depicted in FIG. 1A. In equation (3.1a2) the weight w given to the Producer's limit is between 0 and 1 and it could be a monotonic function of several factors, including the index of trustworthiness defined above. To reiterate, this index could be defined as a fraction of time in which the outcomes of Producer's and Consumer's tests agreed on acceptance of a module. Other factors influencing w can depend on Consumer's situation, such as availability of testing equipment or time pressures. Willingness of the Consumer to give weight to Producer's data or confidence bounds (at least under some conditions) provides an incentive for Producer to share his data. For the Consumer, such sharing presents an opportunity to achieve his testing objectives with lower (Tb, Tg) and lower investment in testing.

If the Producer has confidence in his background measurement equipment, he may consider different regimes of background radiation measurements that would lead to time savings. For example, he might give some weight to background measurements observed in the previous periods and thus consider $\tilde{T}_b$ and $\hat{Y}$ as a combination of test times and counts involving not only present, but also past periods. For example, they could represent the last two periods only, where last period is represented completely and the previous one partially, are also possible.

Given the conflicting interests of Consumer and Producer, it is important to institute come kind of a joint policy in order to prevent substandard product from entering the field. One way to do it would be by introducing a cost structure. Clearly, the Producer has his own cost structure and motivation for making sure that only pre-screened modules that have a high chance of passing the tests would be shipped to the Consumer. Given that the Producer (most likely) has a much wider developed infrastructure for high-quality module manufacturing and screening compared to the Consumer, the burden of quality assurance, including sufficiently stringent radiation testing procedures, should be undoubtedly the responsibility of the Producer. This is especially important if the Consumer chooses to rely, completely or partially, on Producer's data to make acceptance/rejection decisions.

In some embodiments, it may be an objective of the Consumer to prevent the situation when modules or lots previously rejected find their way back into his stream without a substantial rework. One way to achieve that would be to institute penalties for every rejected module and/or lot, along with well defined rework procedures required before modules could be once again considered for shipment.

Another possibility for a joint policy is to rely on the combination of Producer's and Consumer's tests in order to determine which modules are shipped. For example, if the Consumer and Producer share the data related to internal testing, they could agree that only the modules that pass both filters are eligible for shipment; such a joint policy would enable one to achieve considerable reduction in the overall testing effort. The Operating Characteristic (OC) curve of such a joint policy is represented by $1-p(\lambda)$, in view of equation (3.5) and FIG. 3.

In some embodiments, with all precautions taken, the acceptance sampling policy based on confidence bounds decidedly protects the interests of the Consumer. The very fact that a decision is accepted on the basis of an upper $(1-\alpha)(100\%)$ confidence bound for the alpha-particle intensity of module $\lambda$, no matter what background radiation levels were recorded prior to module testing, ensures a fixed level of protection for Consumer against accepting modules of radiation higher than the alpha-particle emissivity specification $\Lambda$. This feature is especially valuable when the Consumer does not vary the test time dynamically to ensure the fixed level of protection for the Producer, but rather relies on accurate measurement of the "prevalent" background intensity $b_0$ (and corresponding test time $T_g$), as in the above described modified policies, i.e., Consumer and Producer Modified Policies. Under such circumstances, the Consumer is still protected even if the background intensity $b$ is underestimated, i.e., the length of time used to measure the alpha-particle count of the module $T_g$ is actually too short to ensure that the Producer's levels below the threshold target alpha particle emissivity $\lambda_0$ are ensured a high enough probability of acceptance. In other words, the risk related to the background underestimation are not shared equitably, but are rather shifted to the Producer. In light of this fact, the Producer could have legitimate concerns that a sizeable fraction of modules rejected by the Consumer are actually of good quality. In the environment of modified policy, the Producer could legitimately demand more equitable risk sharing with respect to possible underestimation of the background intensity by the Consumer. In the next section we introduce Likelihood Ratio test procedures that are more balanced in this respect and provide additional flexibility on adjusting the shape of the Operating Characteristic (OC) curves.

Acceptance sampling procedures based on likelihood ratio (LR) tests.

In some embodiments, likelihood ratio (LR) methodology for hypothesis is preferred by statisticians for this type of problems, because it may lead to substantially optimal resolution properties that manifest themselves in terms of steeper Operating Characteristic (OC) curves when compared to the Operating Characteristic (OC) curves produced by the confidence bounds (CB) sampling described above. The likelihood ratio (LR) methodology takes explicitly into account the Consumer's alpha-particle emissivity specification $\Lambda$ and the Producer's protected level of t alpha particle emissivity $\lambda_0$, in which $\lambda_0 < \Lambda$. The likelihood ratio (LR) test is in contrast to the methodology based on confidence bounds, which uses the alpha-particle emissivity specification $\Lambda$ and Producer's protected level of alpha particle emissivity $\lambda_0$ only as part of decision thresholds, while the confidence bounds themselves are entirely data-driven.

In some embodiments, the basic procedure calls for rejection of the module if the related data is "better" explained by the underlying emissivity $\Lambda$ than by $\lambda_0$. For the purposes of the likelihood ratio (LR) methodology, a determination of "better" is whether the observed alpha-particle intensity of module $\lambda$ is closer to the Producer's protected level of alpha particle emissivity $\lambda_0$ or to the alpha-particle emissivity specification $\Lambda$, i.e., whether level $\lambda = \Lambda$ or level $\lambda = \lambda_0$. In particular, denote by $\ln \hat{L}$ the optimal log-likelihood by equation (2.2) obtained under the assumption that the parameter values $(b, \lambda)$ are set to the MLE's by equation (2.4). Denote by $\ln [L(\lambda)]$ the optimal log-likelihood obtained under the assumption that the value of $\lambda$ is fixed by equations (A.1)-(A.2). Now define D based on the MLE $\hat{\lambda}$ as follows:

(a) If $\hat{\lambda} < \lambda_0$ then $D = \ln [L(\Lambda)] - \ln \hat{L}$ (b) If $\hat{\lambda} > \Lambda$ then $D = \ln \hat{L} - \ln [L(\lambda_0)]$ (c) If $\lambda_0 \leq \hat{\lambda} \leq \Lambda$ then $D = \ln [L(\Lambda)] - \ln [L(\lambda_0)]$ \hfill (3.8)

D measures the degree of evidence that the process is "bad", relative to the hypothesis that the process is "good". If this degree of evidence D exceeds an acceptance threshold H, we will act by rejecting the module. It is clear that $D > 0$ in the case (a), and $D < 0$ in case (b).

The acceptance threshold parameter H is set, and a Consumer's policy is set as follows:

if $D > H$ then reject the module if $D \leq H$ then accept the module \hfill (3.9)

As in the previous case, the Consumer would like to be $(1-\alpha)(100\%)$ confident that his spec $\Lambda$ has not been violated. This requirement is achieved by selecting the acceptance threshold H to be sufficiently low based on the equation:

$$P(D > H | \lambda = \Lambda, b = \hat{b}) = 1 - \alpha, \quad (3.10)$$

Computing the level H typically involves simulation. In what follows, the solution of equation (3.10) is referred to as $H(T_g, \alpha)$, to emphasize its dependence on these two parameters.) In some embodiments, in the process of solving equation (3.10) one may determine H, the background alpha-particle intensity b and the length of time used to measure background alpha-particle count $T_b$ are treated as known quantities.

In practice, however, the Consumer typically can not act in such a unilateral fashion, because it can be advantageous for the Consumer to provide a certain level of protection for the Producer. Thus, the Consumer needs a good understanding of what levels of excess radiation $\lambda$ can be considered acceptable. Accordingly, the Consumer could pick an acceptable value for the alpha particle emissivity $\lambda_0$ (i.e., consumer-protected level of emissivity) that is less than the alpha-particle emissivity specification, i.e., $\lambda_0 < \Lambda$, and declare the following Consumers Policy:

(Step 1) Take a background alpha-particle measurement of length $T_b$. Denote by Y the observed count of alpha-particles and by $\hat{b} = Y/t_b$ the corresponding MLE of the alpha-particle intensity of the background b.

(Step 2) Calculate the necessary test time $T_g$ and the corresponding acceptance threshold $H(T_g, \alpha, \gamma)$ so as to satisfy the equations (3.10) and the following equation (3.11):

$$P(D > H(T_g, \alpha, \gamma) | \lambda = \lambda_0, b = \hat{b}) = \gamma, \quad (3.11)$$

where γ is the Producer's risk. In effect, we are performing a one search for the length of the test time used to measure the alpha-particle count of the module $T_g$ leading to acceptance threshold H that solves both equations (3.10) and (3.11). In some embodiments, equations 3.10 and 3.11 are solved after observing the number of alpha-particle counts Y detected during the background measurement.

Step 3) Take the module alpha-particle measurement of the length of time used to measure the alpha-particle count of the module Tg. Denote by X the observed count of alpha-particles.

(Step 4) Compute D in accordance with equation (3.8). If $D > H(T_g, \alpha, \gamma)$ then reject the module. Otherwise, if $D \leq H(T_g, \alpha, \gamma)$ accept the module.

In practice it may not be convenient to change the length of time used to measure the alpha-particle count of the module $T_g$ every time a new module is put on test. Therefore, one could opt for a simpler policy that relates to the effective background counts and testing times $(Y_0, T_{b0})$, and the corresponding "prevailing" background intensity $b_0 = Y_0 / T_{b0}$. One possibility of a Modified Consumer Policy is implemented by iterating the following steps:

(Step 1) Take a background alpha-particle measurement of length $T_b$. Denote by Y the observed count of alpha-particles. If, in light of this measurement, one can conclude that the current level of the alpha-particle intensity of the background b differs from prevailing estimated level of the alpha particle intensity of the background $b_0$ by an amount higher than some pre-specified value δ, then re-compute the prevailing level $b_0$ (and the corresponding $Y_0, T_{b0}$) and re-calculate the length of time used to measure the alpha-particle count of the module $T_g$ and the corresponding acceptance threshold $H(T_g, \alpha, \gamma)$ so as to satisfy the relations:

$$P(D > H^*(T_g, \alpha, \gamma) | \lambda = \Lambda, b = b_0) = 1 - \alpha, \quad (3.10a)$$

$$P(D > H^*(T_g, \alpha, \gamma) | \lambda = \lambda_0, b = b_0) = \gamma, \text{ where } \gamma \text{ is the Producer's risk} \quad (3.11a)$$

Otherwise, continue using the current values of $(b_0, Y_0, T_{b0}, T_g, H^*(T_g, \alpha, \gamma))$ where H* is the acceptance threshold using the policy described.

(Step 2) Take the module alpha-particle measurement of length $T_g$. Denote by X the observed count of alpha-particles.

(Step 3) Compute D (based on $Y_0, T_{b0}, X, T_g$) in accordance with equation (3.8). If $D > H(T_g, \alpha, \gamma)$ then reject the module. Otherwise, if $D \leq H(T_g, \alpha, \gamma)$ then accept the module.

The Consumer's policy can be characterized in terms of an Operating Characteristic (OC) curve of type shown in FIG. 2. It is also noted that the Consumer's policy for the likelihood ratio (LR) tests may be modified in a manner similar to the ways that the Consumer's Policy of the Confidence bounds (CB) tests are modified to provide the Modified Consumers Policy.

The likelihood ratio (LR) approach can appear to be more complex than the Confidence bounds (CB) approach. However, the computational difference is typically insignificant, since in both cases a search is performed for two quantities: (confidence bound, $T_g$) in the case of the Confidence bounds (CB) approach, and (H, $T_g$) in the case of likelihood ratio (LR) approach. In case when the model is estimated under similar conditions (for example, fixed level of b and fixed observed background count Y), the Confidence bounds (CB) and likelihood ratio (LR) approaches deliver roughly similar values of the length of time used to measure the alpha-particle count of the module $T_g$ and similar Operating Characteristic (OC) curves. The main difference between these two approaches is in case where background intensity is underestimated and, as a result, the module measurement time $T_g$ is too short to ensure protection of both Consumer's and Producer's interests. Under such conditions, the Confidence bounds (CB) approach will generally protect the Consumer at the expense of the Producer. The Consumer will get his nominal high rejection rate $(1-\alpha)(100\%)$ for $\lambda = \Lambda$, but the Producer will get a higher than the nominal low rejection rate $\gamma(100\%)$ for $\lambda = \lambda_0$. In contrast to the Confidence bounds (CB) approach, the likelihood ratio (LR) technique will "spread the risk". The Consumer will get somewhat lower rejection rate than $(1-\alpha)(100\%)$ for $\lambda = \Lambda$, while the Producer will get somewhat higher rejection rate than $\gamma(100\%)$ for $\lambda = \lambda_0$. So, in the environment where the length of time used to measure the alpha-particle count of the module $T_g$ might be underestimated, the likelihood ratio (LR) approach can be viewed as one that is more fair to both the Consumer and the Producer.

Situations where the length of time used to measure the alpha-particle count of the module $T_g$ might be underestimated can occur naturally, for example, under the conditions where the background is measured both immediately before and immediately after the module test. Denote the outcomes of these tests $Y_1$ and $Y_2$. When the length of time used to measure the alpha-particle count of the module $T_g$ is chosen dynamically, only $Y_1$ can influence its selection. Once $Y_2$ is also measured, the fate of the module is decided based on the combined background count $Y = Y_1 + Y_2$. At that point, the Consumer might conclude that the length of time used to measure the alpha-particle count of the module $T_g$ was too short; however, based on the Confidence bounds (CB) policy, it is the Producer who will pay the price for this underestimation by accepting a higher than nominal rejection risk at $\lambda = \lambda_0$.

From the Producer's perspective, the likelihood ratio (LR) policy could be used to ensure that his internal acceptance testing procedure does its part in preventing modules that have an unacceptably high chance of rejection to be shipped to the Consumer. The general approach is similar to that described above; the Producer could, for example, designate $(\tilde{\lambda}_0, \lambda_0)$ as his internal acceptable and unacceptable rates, and then design internal tests similar to those used by the Consumer. As in the case of Confidence bounds (CB) approach, collaboration between Consumer and Producer leads to substantial savings in testing effort. The details are omitted. Note that the Producer could opt for Confidence bounds (CB) approach even when the Consumer is using the likelihood ratio (LR) approach, and vice versa.

In some embodiments, a policy may be employed that establishes the length of time $T_b$ used to measure background alpha-particle count, and the length of time Tg used to measure the alpha-particle count of the module simultaneously by assuming that the background emissivity is known and equal to some "historically prevailing" value $b_0$. The length of time $T_b$ used to measure background alpha-particle count, and the length of time Tg used to measure the alpha-particle count of the module is established by using the Consumer's Policy described above, with the only difference that for every selected time $T_b$ used to measure background alpha-particle count, the value corresponding value for the length of time Tg used to measure the alpha-particle count of the module should satisfy the equation:

$$P_{reject}(\lambda = \lambda_0 | \text{Test Duration} = T_g, b = b_0) = \gamma, \quad (3.12)$$

When designing a testing scheme, the equation (3.12) is not solved for every simulated case. Rather by a direct search for every candidate value of $T_g$ the sample counts are re-simulated, acceptance/rejection criterion is computed for every simulated case, and the difference between the LHS and RHS of equation (3.12) is examined. This process continues until $T_g$ is found for which the above equation holds. In some embodiments, the advantage of this method is that we can evaluate the total time for decision $(T_b+T_g)$ ahead of time, before taking the background measurement. Note that $b_0$ is only used to help establish the testing times $(T_b, T_s)$. The subsequent implementation of the policy is entirely data-driven. The value of $\gamma=0.1$ is suitable for many practical applications. This method can be used both in conjunction with the confidence bounds approach and in conjunction with likelihood ratio approach.

The present disclosure provides a general framework for module acceptance testing based on measuring the alpha particle emission from the module. The present disclosure provided two methodologies: one based on the confidence bounds (CB), and another based on likelihood ratio tests (LR). In the context of confidence bounds (CB) approach, the profile likelihood methodology has superior statistical properties (compared to Gaussian approximation), as it is less biased in favor of the Producer. In some embodiments, while the confidence bounds (CB) approach is shown to be quite useful in the environment where testing times can be changed dynamically, the likelihood ratio (LR) approach tends to be somewhat more balanced in the way it handles Consumer/Producer risk tradeoffs when decisions are made based on testing times that are kept relatively stable, for reasons of logistics or convenience.

The confidence bounds (CB) approach and likelihood ratio (LR) methodologies can be used to develop an alpha-particle emission testing strategy for materials used to manufacture semiconductors. This type of methodologies become increasingly useful as the quality of measurement equipment improves, leading to ultra-low levels of background radiation. Of special importance is the issue of relationship between the Producer and Consumer in this setting. In some embodiments, the present disclosure provides a framework where these parties are able to protect their interests working independently. When trust between parties exists, the Consumer and Producer can achieve considerable savings by developing a joint strategy and utilizing each others data.

In the process of background measurements, one could take advantage of the properties of data taken in consecutive time periods. When this data shows stability, justification exists for pooling measurements from consecutive periods; this enables one to estimate reliably prevailing background radiation by taking systematic measurements for relatively short time periods. Furthermore, the possibility exists for estimating background based on current and previous periods by using the data that comes from both background and module measurements. Of special importance are estimation methods based on use of statistical monitoring, as modifications to prevailing background rates and testing times are made on the basis of signals produced by control schemes. These techniques are especially useful in the context of modified testing policies discussed in the acceptance sampling procedures that are based on the confidence bounds (CB).

Figure 4:
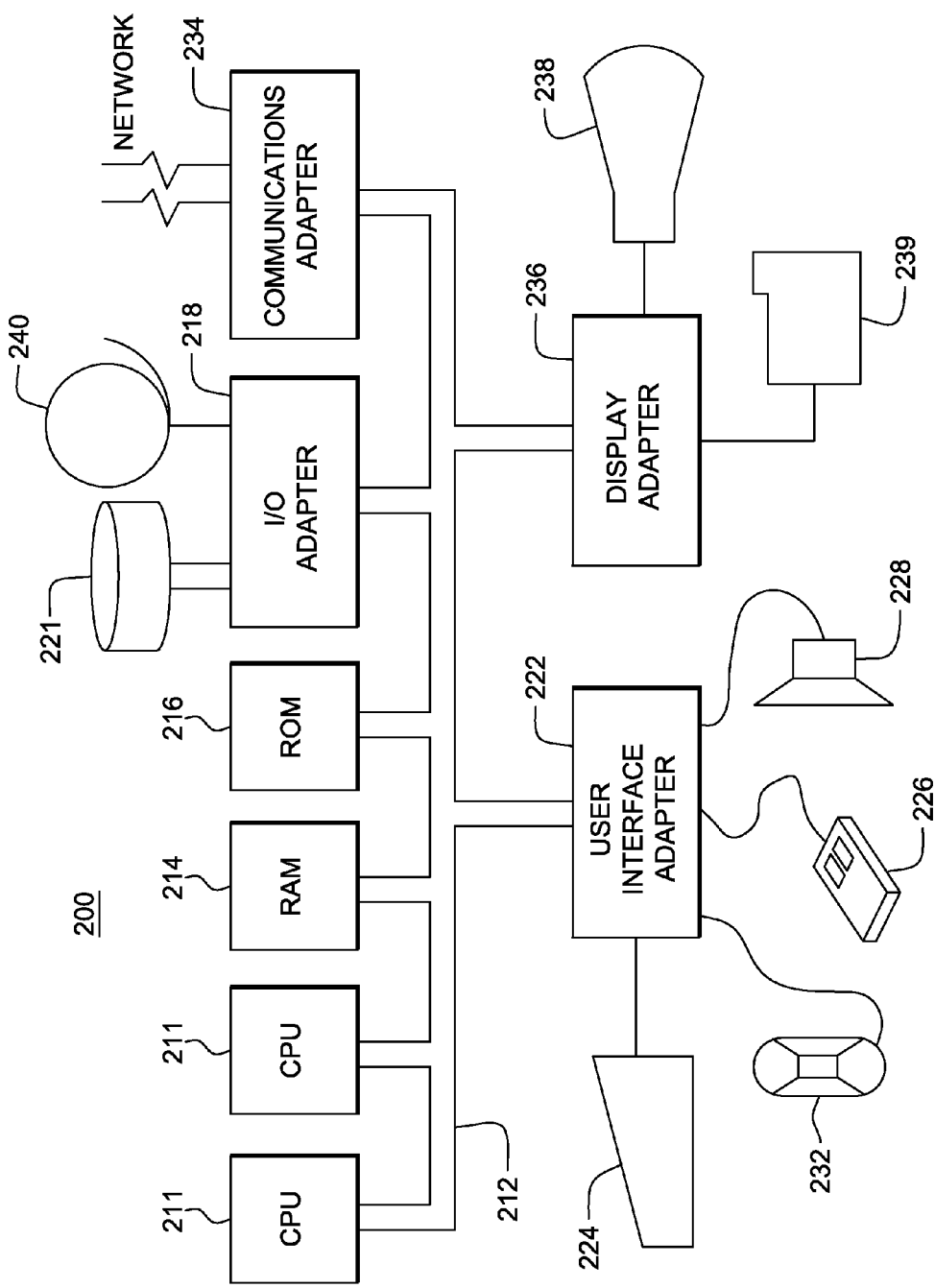
FIG. 4 illustrates an exemplary hardware configuration of a computing system infrastructure 200 in which the present methods are run.

FIG. 4 illustrates an exemplary hardware configuration of a computing or mobile device computing system infrastructure 200 in which the present methods are run. In one aspect, computing system 200 is programmed to perform the method processing steps disclosed herein, e.g., the process steps depicted in FIGS. 1A and 1B. The hardware configuration preferably has at least one processor or central processing unit (CPU) 211. The CPUs 211 are interconnected via a system bus 212 to a random access memory (RAM) 214, read-only memory (ROM) 216, input/output (I/O) adapter 218 (for connecting peripheral devices such as disk units 221 and tape drives 240 to the bus 212), user interface adapter 222 (for connecting a keyboard 224, mouse 226, speaker 228, disk drive device 232, and/or other user interface device to the bus 212), a communication adapter 234 for connecting the system 200 to a data processing network, the Internet, an Intranet, a local area network (LAN), etc., and a display adapter 236 for connecting the bus 212 to a display device 238 and/or printer 239 (e.g., a digital printer of the like).

Any combination of one or more computer readable medium(s) may be utilized in combination with the methods and process flows disclosed herein. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any programming language or any combination of one or more programming languages, including an object oriented programming language such as Java, Smalltalk, C++ or the like or a procedural programming language, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described herein with reference to flowchart illustrations and/or block diagrams of methods, systems and/or computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus or other devices provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The following examples are provided to further illustrate the methods of the present disclosure and demonstrate some advantages that arise therefrom. It is not intended that the present disclosure be limited to the specific examples disclosed.

EXAMPLES

In the following example, the Consumer's background measurement equipment provides a consistent flow of alpha-particles with intensity not exceeding 2 particles per hour (p/h). Suppose that the alpha-particle emissivity specification $\Lambda$ set by the Consumer is equal to 2 p/h and the threshold target alpha particle emissivity $\lambda_0$ (for which the Consumer assures the acceptance probability $1-\gamma=0.9$) is equal 0.5 p/h. The length of time for background measurement is $T_b=20$ hrs and the Consumer decides on accepting/rejecting a module (and a lot from which it comes) based on the 95% upper confidence bound for $\lambda$, $\overline{\lambda}_{0.95}$ (i.e., $\alpha=0.05$). In accordance with Consumer's policy, a module is accepted if $\overline{\lambda}_{0.95}<2$. Given the level of $\gamma=0.1$, the test time computation yields $T_g=17$ hours. The performance of the procedure is illustrated in Table 4.1. The results in Table 4.1 are based on 50,000 simulated replications of the experimental conditions.

TABLE 4.1

| $\lambda$ | Bias (%) | Escape (%) | $P_{accept}$ | $P_{accept}$ (G) |
| --- | --- | --- | --- | --- |
| 0.2 | 108 | 5.2 | 97.6 | 97.9 |
| 0.5 | 16 | 5.2 | 90.1 | 90.8 |
| 1.0 | 0.96 | 5.2 | 58.6 | 60.0 |
| 1.5 | −0.07 | 5.2 | 23.2 | 24.2 |
| 2.0 | −0.12 | 5.2 | 5.20 | 5.52 |
| 2.5 | −0.09 | 5.2 | 0.73 | 0.80 |
| 3.0 | −0.09 | 5.1 | 0.07 | 0.08 |

One can see that the value $\lambda=\Lambda=2$ p/h has indeed the acceptance rate of 5.2% (instead of the nominal 5%), and for $\lambda=\lambda_0=0.5$ p/h the acceptance probability is 0.90, as promised to the Producer. The "Bias" column of Table 4.1 indicates that under the stated conditions the bias of the estimation procedure is quite low, except for low levels of $\lambda$, when the fact that we do not allow negative values for $\hat{\lambda}$ leads to strong overestimation (for example, for $\lambda=0.2$ the positive bias is 108%). The confidence bounds obtained under the procedure of for the Poisson radiation model (equations 2.1 to 2.8) provide coverage probability which is very close to the nominal 95% (see the complementary Escape probability in Table 4.1). The results in Table 4.1 are based on 50,000 simulated replications of the experimental conditions.

For comparison, the acceptance probability was obtained under the Gaussian approximation to the sampling distribution of $\hat{\lambda}$, as described in Poisson radiation model (equations 2.1 to 2.8). One can see that the Gaussian approximation indeed favors the Producer, by providing a somewhat higher than nominal acceptance rate both at the threshold target alpha particle emissivity $\lambda_0$ and the alpha-particle emissivity specification $\Lambda$.

The quality of Gaussian approximation deteriorates further if the background intensity can be reduced further, as a result of technological advance. For example, Table 4.2 shows results obtained under the assumption alpha-particle intensity (e.g., particles "p" per hour) of the background b is equal to 1.5 p/h. Under this assumption, we once again use $T_b=20$ hrs to measure the background. The threshold value in Table 4.2 is $\Lambda=2$ p/h and the acceptable value is $\lambda_0=0.5$ p/h. However, the module test time can now be reduced to $T_g=12$ hours.

TABLE 4.2

| $\lambda$ | Bias (%) | Escape (%) | $P_{accept}$ (%) | $P_{accept}$ (G) |
| --- | --- | --- | --- | --- |
| 0.2 | 102 | 5.3 | 97.1 | 97.7 |
| 0.5 | 15 | 5.3 | 88.4 | 90.1 |
| 1.0 | 0.92 | 5.3 | 55.6 | 58.8 |
| 1.5 | −0.08 | 5.2 | 21.9 | 24.3 |
| 2.0 | −0.12 | 5.2 | 5.20 | 6.00 |

TABLE 4.2-continued

| λ | Bias (%) | Escape (%) | $P_{accept}$ (%) | $P_{accept}$ (G) |
|---|---|---|---|---|
| 2.5 | −0.11 | 5.4 | 0.84 | 1.03 |
| 3.0 | −0.10 | 5.1 | 0.09 | 0.13 |

For the Gaussian approximation, one can once again see that the Consumer's protection level at the alpha-particle emissivity specification Λ=2 is not met (the acceptance rate it 6% instead of the nominal 5). The exact procedure of Poisson radiation model can be seen as much more fair in the sense that it gets closer to nominal levels for $\lambda_0$ and Λ (slightly under-protecting both the Consumer and the Producer). The escape probabilities for the Gaussian procedure are not shown. They are uniformly worse than for the procedure of the Poisson radiation model (equations 2.1 to 2.8), and in the case that the alpha-particle intensity of the background b=1.5 p/h, the escape percentages of the Gaussian procedure are 6% or higher (instead of the nominal 5%).

With measurement tools having background radiation levels not exceeding 0.5 p/h, the measurement times can be reduced considerably. For example, Table 4.3 shows results for b=0.5 p/h ($T_b$=20 hrs). The threshold value in Table 4.3 is Λ=2 particles per hour, and the acceptable value is $\lambda_0$=0.5 p/h. One can see that the desired protection of Producer's and Consumer's interests can now be achieved in $T_g$=6.6 hours.

TABLE 4.3

| λ | Bias (%) | Escape (%) | $P_{accept}$ (%) | $P_{accept}$ (G) |
|---|---|---|---|---|
| 0.2 | 61.9 | 6.1 | 98.5 | 99.2 |
| 0.5 | 7.4 | 6.0 | 90.0 | 93.6 |
| 1.0 | 0.22 | 5.9 | 54.8 | 63.4 |
| 1.5 | −0.15 | 5.8 | 21.3 | 27.9 |
| 2.0 | −0.13 | 5.5 | 5.51 | 8.17 |
| 2.5 | −0.14 | 5.7 | 1.10 | 1.84 |
| 3.0 | −0.12 | 5.7 | 0.18 | 0.32 |

The Gaussian approximation is quite unreliable under these conditions, leading to strong under-protection for the Consumer (the acceptance rate at alpha-particle emissivity specification Λ=2 is 8.2%) and over-protection for the Producer (the acceptance rate at threshold target alpha particle emissivity $\lambda_0$=0.5 is 93.4%). Clearly, Gaussian approximation under these conditions is too crude to be of practical value.

If the background rate, i.e., alpha-particle intensity of the background, is b=1.0 p/h (instead of the assumed b=0.5 p/h), then the length of time used to measure the alpha-particle count of the module $T_g$=6.6 hours is too short to provide the necessary degree of protection for both parties, as illustrated in Table 4.3a. The threshold value in Table 4.3A is Λ=2 particles per hour, and the acceptable value is $\lambda_0$=0.5 p/h. In this example, it is the Producer who suffers as a result of such underestimation. For example, if the Producer ships a module with intensity λ=0.2 p/h, then $P_{accept}$=93.4%, and $P_{accept}$(λ=$\lambda_0$=0.5 p/h)=79.7% instead of the nominal 90%. In contrast, the Consumer's level of protection remains basically intact.

TABLE 4.3a

| λ | Bias (%) | Escape (%) | $P_{accept}$ (%) | $P_{accept}$ (G) |
|---|---|---|---|---|
| 0.2 | 106 | 5.6 | 93.4 | 95.7 |
| 0.5 | 18 | 5.7 | 79.7 | 85.0 |

TABLE 4.3a-continued

| λ | Bias (%) | Escape (%) | $P_{accept}$ (%) | $P_{accept}$ (G) |
|---|---|---|---|---|
| 1.0 | 1.4 | 5.6 | 45.9 | 53.6 |
| 1.5 | 0.6 | 5.3 | 18.3 | 23.8 |
| 2.0 | −0.15 | 5.4 | 5.4 | 7.63 |
| 2.5 | −0.14 | 5.5 | 1.30 | 1.93 |
| 3.0 | −0.11 | 5.5 | 0.24 | 0.37 |

In another example, it is assumes that at the producer's disposal is measurement equipment capable of producing the background levels of b=0.2 p/h. Given the Consumer's 90% protection for the level $\lambda_0$=0.5 p/h, the Producer's plan calls for (internal) acceptance of a module only if the upper 75% confidence bound for λ is below 0.5. With this choice, the probability that a module of level λ=$\lambda_0$=0.5 will end up rejected by the Customer's filter is provided by equation (3.7), as follows:

$$p_d(\lambda_0)=[1-\tilde{P}_{reject}(\lambda_0)]\times P_{reject}(\lambda_0)=(1-0.75)\times(1-0.9)=0.025,$$

In other words, with combination of Producer's and Consumer's filters, a module of level $\lambda_0$=0.5 p/h is much less likely to end up in the Consumers products.

The properties of the Producer's plan are shown in Table 4.4 (results are based on 50,000 simulated replications). This plan corresponds to nominal parameters $\tilde{\lambda}_0$=0.2 p/h, $\lambda_0$=0.5 p/h, $\tilde{T}_b$=24 hours, $\tilde{T}_g$=24 hours, $\tilde{\alpha}$=0.25, γ=0.1.

TABLE 4.4

| λ | Bias (%) | Escape (%) | $P_{accept}$ (%) | AvgBound |
|---|---|---|---|---|
| 0.1 | 40.3 | 26.9 | 97.6 | 0.204 |
| 0.2 | 6.94 | 26.7 | 87.8 | 0.309 |
| 0.3 | 1.35 | 26.1 | 68.3 | 0.417 |
| 0.5 | −0.10 | 25.7 | 25.7 | 0.633 |
| 0.7 | −0.13 | 26.4 | 5.40 | 0.847 |
| 1.0 | −0.11 | 26.6 | 0.3 | 1.17 |
| 1.5 | −0.08 | 26.0 | 0.002 | 1.69 |

One can see (based on 50,000 simulated replications) that the Producer's acceptance rate at $\tilde{\lambda}_0$=0.2 p/h appears to be slightly less than nominal (87.8% instead of (1−$\tilde{\gamma}$)(100%)=90%) and the acceptance rate at $\lambda_0$=0.5 p/h is slightly higher than nominal (25.7% instead of $\tilde{\alpha}$(100%)=25%). The last column in Table 4.4 corresponds to the average upper confidence bound for λ observed for the simulated replications.

Returning to the case where Consumer's equipment is capable of b=0.5 p/h, and let us assume that $b_0$=0.5 p/h is the currently prevailing background rate. The selected parameters are the same as before: $T_b$=20 hrs, $T_g$=6.6 hours, Λ=2 p/h, $\lambda_0$=0.5 p/h. In line with the Modified Consumer's LR policy, we compute the acceptance threshold H=−0.752 (computed based on 50,000 simulated replications) so as to assure $P_{accept}$(Λ)=5.51%. This choice is motivated by our desire to compare the OC curve against the one given in Table 4.3.

The resulting OC curve is shown in Table 4.5 (column 3)—it is virtually indistinguishable from that in Table 4.3, indicating that under the assumed conditions the CB and LR methods show similar performance. Table 4.5 includes the performance of the Consumer's plan corresponding to b=0.5 p/h under the LR approach. The parameters are the same as for Tables 4.3-4.3a. Columns 3 and 4 correspond to the case when the prevalent background radiation is 0.5 p/h (acceptance threshold H=−0.752 leads to OC curve similar to that in Table 4.3). Columns 4 and 5 correspond to use of the same acceptance threshold H under the assumption that the background is 1.0 p/h.

TABLE 4.5

| $\lambda$ | $D_{avg}$ (b = 0.5) | $P_{accept}$ (%) | $D_{avg}$ (b = 1.0) | $P_{accept}$ (b = 1.0) |
|---|---|---|---|---|
| 0.2 | −6.25 | 98.3 | −4.74 | 94.5 |
| 0.5 | −3.98 | 89.3 | −3.11 | 82.7 |
| 1.0 | −1.09 | 54.0 | −1.03 | 51.2 |
| 1.5 | 0.62 | 20.9 | 0.22 | 22.7 |
| 2.0 | 1.13 | 5.50 | 0.73 | 7.32 |
| 2.5 | 1.28 | 1.11 | 1.02 | 1.94 |
| 3.0 | 1.79 | 0.19 | 1.54 | 0.39 |

The 2nd column of the table gives the average values of the log-Likelihood ratio D, see (3.8). As in the case discussed earlier, if the actual background intensity is b=1.0 p/h, the time $T_g$=6.6 hours is too short to protect both parties. Unlike in the CB case (see Table 4.3a) in which the risk is absorbed by the Producer, the LR approach leads to risk sharing: for example, if the Producer ships a module with intensity $\lambda$=0.2 p/h, then $P_{accept}$=94.5%, and $P_{accept}$ ($\lambda$=$\lambda_0$=0.5 p/h)=82.7% instead of the nominal 90%. At the same time, the Consumer's level of protection degrades to $P_{accept}$($\lambda$=$\Lambda$=2 p/h) 7.32% instead of the nominal 5.51%.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed:

1. A method for determining whether a material meets an alpha particle emissivity specification that comprises:
   receiving, at a hardware processor, an alpha particle emissivity specification $\Lambda$ for a module of emissive material;
   calculating, at the hardware processor, a time $T_b$ for obtaining a background alpha particle emissivity measurement of a particle counter device used for measuring an alpha particle emissivity for the module; and
   iteratively performing:
   measuring, at the counter device, a background alpha particle emissivity for the counter device using the time $T_b$ for background emissivity measurement;
   calculating a time $T_g$ for obtaining an alpha particle emissivity measurement of a sample of the module within the counter device using a Poisson based statistical model for alpha particle emissivity, the Poisson based model providing a level of protection for both a consumer and a producer of the module by integrating a consumer specified threshold alpha-particle emissivity that is less than said alpha particle emissivity specification $\Lambda$ for the module and of a value representative of a producer's risk of module rejection;
   measuring, at the counter device, a combined alpha particle emissivity for the counter device containing a sample of the module of emissive material for the time $T_g$ for the emissivity measurement of the sample of the module within the counter device;
   computing, at the hardware processor, a decision statistic based on said background alpha particle emissivity, the combined alpha particle emissivity and said times $T_b$ and $T_g$;
   comparing, at the hardware processor, the decision statistic to the alpha particle emissivity specification $\Lambda$; and
   deploying, to a consumer, a batch of said emissive material from which said module was taken for use in a product if the decision statistic is less than or equal to the alpha particle emissivity specification $\Lambda$, or preventing a deployment to the consumer of the batch of said emissive material from which said module was taken if the decision statistic exceeds the alpha particle emissivity specification $\Lambda$.

2. The method of claim 1, where the decision statistic is the upper (1−$\alpha$)*100% confidence bound for an alpha-particle emissivity of module $\lambda$.

3. The method of claim 1, where the decision statistic is evidence that the alpha-particle emissivity of module is unacceptable computed based on a statistical likelihood ratio test.

4. The method of claim 1, wherein the threshold alpha-particle emissivity includes a pre-specified consumer-protected alpha particle emissivity $\lambda_0$ that is below the alpha particle emissivity specification for the module.

5. The method of claim 1, wherein said calculating time $T_b$ for background emissivity measurement for the counter device and the time $T_g$ for the emissivity measurement of the sample within the counter device using the Poisson based statistical model includes imputing at least an estimated background, $b_0$ emissivity and the alpha particle emissivity specification into the Poisson based statistical model.

6. The method of claim 1, wherein the pre-specified consumer-protected alpha particle emissivity $\lambda_0$ is a value for which the probability of module acceptance is (1−$\gamma$) *100%, where $\gamma$ is a value representing a producer's risk.

7. A computer program product for determining whether a material meets an alpha particle emissivity specification, the computer program product comprising a non-transitory computer readable storage medium, said non-transitory medium tangibly embodying a program of instructions executable by the computer for:
   receiving an alpha particle emissivity specification $\Lambda$ for a module of emissive material;
   calculating a time $T_b$ for obtaining a background alpha particle emissivity measurement of a particle counter device used for measuring an alpha particle emissivity for the module; and
   iteratively performing:
   measuring, at the counter device, a background alpha particle emissivity for the counter device using the time $T_b$ for background emissivity measurement;
   calculating a time $T_g$ for obtaining an alpha particle emissivity measurement of a sample of the module within the counter device using a Poisson based statistical model for alpha particle emissivity, the Poisson based model providing a level of protection for both a consumer and a producer of the module by integrating a consumer specified threshold alpha-particle emissivity that is less than said alpha particle emissivity specification $\Lambda$ for the module and of a value representative of a producer's risk of module rejection;
   measuring, at the counter device, a combined alpha particle emissivity from the counter device containing the sample of the emissive material for the time $T_g$ for the emissivity measurement of the sample of the module within the counter device, computing a decision statistic based on said background alpha particle emissivity, the combined alpha particle emissivity and said times $T_b$ and Tg;

comparing the decision statistic to the alpha particle emissivity specification Λ; and deploying, to a consumer, a batch of said emissive material from which said module was taken for use in a product if the decision statistic is less than or equal to the alpha particle emissivity specification Λ, or preventing a deployment to the consumer of the batch of said emissive material from which said module was taken if the decision statistic exceeds the alpha particle emissivity specification Λ.

8. The computer program product of claim 7, where the decision statistic is the upper $(1-\alpha)*100\%$ confidence bound for an alpha-particle emissivity of module λ.

9. The computer program product of claim 7, where the decision statistic is evidence that the alpha-particle emissivity of module is unacceptable computed based on a statistical likelihood ratio test.

10. The computer program product of claim 7, wherein the threshold alpha-particle emissivity includes a pre-specified consumer-protected alpha particle emissivity $\lambda_0$ that is below the alpha particle emissivity specification for the module.

11. The computer program product of claim 7, wherein said calculating the time $T_b$ for background emissivity measurement for the counter device and the time $T_g$ for the emissivity measurement of the sample within the counter device using the Poisson based statistical model includes imputing at least an estimated background, $b_0$ emissivity and the alpha particle emissivity specification into the Poisson based statistical model.

12. The computer program product of claim 7, wherein the pre-specified consumer-protected alpha particle emissivity $\lambda_0$ is a value for which the probability of module acceptance is $(1-\gamma)*100\%$, where γ is a value representing a producer's risk.

13. A system for indicating whether a material meets an alpha particle emissivity specification comprising:
a memory storage device;
a hardware processor in communication with said memory storage device and configured to:
receive an alpha particle emissivity specification Λ for a module of emissive material;
calculate a time $T_b$ for obtaining a background alpha particle emissivity measurement of a particle counter device used for measuring an alpha particle emissivity for the module; and an iterative process to:
measure, at the counter device, a background alpha particle emissivity for the counter device using the time $T_b$ for background emissivity measurement;
calculate a time $T_g$ for obtaining an alpha particle emissivity measurement of a sample of the module within the counter device using a Poisson based statistical model for alpha particle emissivity, the Poisson based model providing a level of protection for both a consumer and a producer of the module by integrating a consumer specified threshold alpha-particle emissivity that is less than said alpha particle emissivity specification Λ for the module and of a value representative of a producer's risk of module rejection;
measure, at the counter device, a combined alpha particle emissivity from the counter containing a sample of the emissive material for the time $T_g$ for the emissivity measurement of the sample of the module within the counter device; and compute a decision statistic based on said background alpha particle emissivity, the combined alpha particle emissivity and said times $T_b$ and $T_g$;

compare the decision statistic to the alpha particle emissivity specification □; and deploy to the consumer a batch of said emissive material from which said module was taken for use in a product if the decision statistic is less than or equal to the alpha particle emissivity specification Λ, or prevent a deploying to the consumer of the batch of said emissive material from which said module was taken if the decision statistic exceeds the alpha particle emissivity specification Λ.

14. The system of claim 13, where the decision statistic is the upper $(1-\alpha)*100\%$ confidence bound for an alpha-particle emissivity of module λ.

15. The system of claim 14, where the decision statistic is evidence that the alpha-particle emissivity of module is unacceptable computed based on a statistical likelihood ratio test.

16. The system of claim 14, wherein the threshold alpha-particle emissivity includes a pre-specified consumer-protected alpha particle emissivity $\lambda_0$ that is below the alpha particle emissivity specification for the module.

17. The system of claim 14, wherein to calculate the time $T_b$ for background emissivity measurement for the counter device and the time $T_g$ for the emissivity measurement of the sample within the counter device using the Poisson based statistical model said hardware processor is further configured to: impute at least an estimated background, $b_0$ emissivity and the alpha particle emissivity specification into the Poisson based statistical model.

18. The system of claim 14, wherein the pre-specified consumer-protected alpha particle emissivity $\lambda_0$ is a value for which the probability of module acceptance is $(1-\gamma)*100\%$, where γ is a value representing a producer's risk.

19. A method for determining whether a material meets an alpha particle emissivity specification comprising:
receiving, at a hardware processor, an alpha particle emissivity specification for a module of emissive material; and
iteratively performing:
measuring, at a particle counter device used for measuring an alpha particle emissivity for the module, a background alpha particle emissivity of the counter device by taking a background alpha-particle measurement Y for a time $T_b$ and calculating a maximum likelihood (MLE) of alpha-particle intensity from $\hat{b}=Y/T_b$;
measuring, at the counter device, a combined alpha particle emissivity of the counter device containing a sample of the module, wherein the combined alpha particle emissivity includes the background alpha particle emissivity in combination with a sample alpha particle emissivity, wherein the measuring of the combined alpha particle emissivity includes calculating a length of time $T_g$ used to measure the combined alpha particle emissivity of the module that satisfies: $P_{reject}(\lambda=\lambda_0|\text{Test Duration}=T_g,b=\hat{b})=\gamma$, said time $T_g$ calculated using a Poisson based statistical model for alpha particle emissivity, the Poisson based model providing a level of protection for both a consumer and a producer of the module where $P_{reject}$ is the probability of rejection, λ is alpha-particle intensity of module, $\lambda_0$ is a pre-specified consumer-protected alpha particle emissivity that is below the alpha particle emissivity specification for the module and of a value representative of a producer's risk of module rejection, and b is the alpha-particle intensity of the background, and γ is a value representing the producer's risk;

calculating, at the hardware processor, an upper confidence bound for the sample alpha particle emissivity from alpha particle counts observed during measuring the background alpha particle emissivity and said measuring the combined alpha particle emissivity; and comparing, at the hardware processor, the upper confidence bound to the alpha particle emissivity specification; and one of:

deploying to the consumer a batch of said emissive material from which said module was taken for use in a product if the said upper confidence bound is less than or equal to the alpha particle emissivity specification, or preventing a deployment to the consumer of the batch of said emissive material from which said module was taken if the said upper confidence bound is greater than the alpha particle emissivity specification.

20. The method of claim 19, wherein the material is one of: a semiconductor material or a metal, a powder, sheet, ingot, wafer or a combination thereof.

21. The method of claim 19, wherein the counter device for measuring the alpha particle emissivity for the material comprises one of: a low background ionization-mode counter, a zinc sulfide counter or a combination thereof.

22. The method of claim 19, further comprising: obtaining an upper confidence bound and a lower confidence bound for the background alpha particle emissivity of the counter device.

23. The method of claim 19, wherein said calculating said upper confidence bound for said sample alpha particle emissivity includes computing:

$$\bar{\lambda}_{1-\alpha}(Gauss) = \hat{\lambda} + z_{1-\alpha}\sqrt{\frac{X}{t_g^2} + \frac{Y}{t_b^2}}$$

where $z_{1-\alpha}$ is the $(1-\alpha)$—quantile of a Gaussian distribution, is the maximum likelihood (MLE), X is absorbed counts by said counter device during said combined alpha particle emissivity, Y is absorbed counts during said background alpha-particle measurement, $T_g$ is said length of time of said the alpha-particle count of the module, and $T_b$ is said length of time of said background alpha-particle measurement.

24. The method of claim 19, wherein said calculating said upper confidence bound comprises a profile likelihood method.

25. The method of claim 19, wherein the comparing of the upper confidence bound to the alpha particle emissivity specification includes computing a probability of acceptance from:

$p(\lambda) = [1-\tilde{P}_{reject}(\lambda)] \times [1-P_{reject}(\lambda)]$ wherein $\tilde{P}_{reject}(\lambda)$ is a producer probability of rejection, and Preject($\lambda$) is equal to a consumer probability of rejection.

26. The method of claim 19, wherein the time of said the alpha-particle count of the module $T_g$, and the $T_b$ time of said background alpha-particle measurement are calculated simultaneously by setting a background emissivity to a historical value.

27. A method for determining whether a material meets an alpha particle emissivity specification that comprises:

receiving, at a hardware processor, an alpha particle emissivity specification for a module of emissive material;

receiving, at the hardware processor, a pre-specified consumer-protected alpha particle emissivity; and iteratively performing:

measuring, at a particle counter device used for measuring an alpha particle emissivity for the module, a background alpha particle emissivity for the counter device;

calculating a time $T_g$ for obtaining an alpha particle emissivity measurement of a sample of the module within the counter device using a Poisson based statistical model for alpha particle emissivity, the Poisson based model providing a level of protection for both a consumer and a producer of the module by integrating a consumer specified threshold alpha-particle emissivity that is less than said alpha particle emissivity specification $\Lambda$ for the module and of a value representative of a producer's risk of module rejection;

measuring, at the counter device, a combined alpha particle emissivity from the counter device containing a sample of the module for the time $T_g$, wherein the combined alpha particle emissivity includes the estimated background alpha particle emissivity in combination with an estimate of a sample alpha particle emissivity;

computing, at the hardware processor, a maximum likelihood estimate of the alpha particle emissivity of the sample from the counts taken during the measurement of the estimated background, the time of the measurement of the estimated background, the counts taken from the measuring of the combined alpha particle emissivity, and the time of the measuring of the combined alpha particle emissivity;

computing, at the hardware processor, whether the maximum likelihood estimate is below the pre-specified consumer-protected alpha particle emissivity, is above the alpha particle emissivity specification or between the pre-specified consumer-protected alpha particle emissivity and the alpha particle emissivity specification to determine a degree of evidence "D" that a process is unacceptable;

comparing, at the hardware processor, the degree of evidence that the process is unacceptable D to a threshold H; and deploying to the consumer a batch of said emissive material from which said module was taken for use in a product if the degree of evidence that the process is unacceptable is less than or equal to the threshold H, or preventing a deployment to the consumer of the batch of said emissive material from which said module was taken if the degree of evidence that the process is unacceptable is greater than the threshold H.

28. The method of claim 27, wherein said determining of a degree of evidence that a process is unacceptable is based upon:

(a) If $\hat{\lambda} < \lambda_0$ then $D = \ln [L(\Lambda)] - \ln \hat{L}$ (b) If $\hat{\lambda} > \Lambda$ then $D = \ln \hat{L} - \ln [L(\lambda_0)]$ (c) If $\lambda_0 \leq \hat{\lambda} \leq \Lambda$ then $D = \ln [L(\Lambda)] - \ln [L(\lambda_0)]$ where is $\hat{\lambda}$ equal to the maximum likelihood estimate of the alpha particle emissivity, $\Lambda$ is equal to the alpha particle emissivity specification, $\lambda_0$ is equal to the pre-specified consumer-protected alpha particle emissivity and D is the degree of evidence that the process is unacceptable.

29. The method of claim 27, further comprising: calculating said threshold H according to:

$P(D>H|\lambda=\Lambda, b=\hat{b}) = 1-\alpha$, and $P(D>H(T_g,\alpha,\gamma)|\lambda=\lambda_0, b=\hat{b}) = \gamma$, where P is the probability of acceptance, $\lambda_0$ is the consumer-protected level of emissivity, $\gamma$ is a producer's risk, Tg is the length of time used to measure the alpha-particle count of the module, and $\alpha$ is a Consumer's risk.

30. The method of claim 29, further comprising: computing the threshold H and the length of time $T_g$ used to measure the alpha-particle count of the module after said measuring said background alpha particle emissivity for the counter device.

* * * * *